United States Patent
Tokunaga et al.

(10) Patent No.: US 7,858,972 B2
(45) Date of Patent: Dec. 28, 2010

(54) MEMORY DEVICE AND SEMICONDUCTOR DEVICE

(75) Inventors: Hajime Tokunaga, Isehara (JP); Kiyoshi Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 603 days.

(21) Appl. No.: 11/785,964

(22) Filed: Apr. 23, 2007

(65) Prior Publication Data

US 2008/0083830 A1    Apr. 10, 2008

(30) Foreign Application Priority Data

Apr. 28, 2006   (JP)   ............... 2006-127087

(51) Int. Cl.
*H01L 35/24* (2006.01)
*H01L 51/00* (2006.01)

(52) U.S. Cl. ............ 257/40; 257/4; 257/5; 438/29; 438/69

(58) Field of Classification Search .......... 257/E51.008, 257/4, 5, 40; 438/29, 69, 82, 99
See application file for complete search history.

(56) References Cited

U.S. PATENT DOCUMENTS

| | | | |
|---|---|---|---|
| 3,833,894 A | 9/1974 | Aviram et al. | |
| 4,115,872 A | 9/1978 | Bluhm | |
| 4,177,475 A | 12/1979 | Holmberg | |
| 5,375,250 A | 12/1994 | Van den Heuvel | |
| 5,621,247 A | 4/1997 | Hirao et al. | |
| 5,714,400 A | 2/1998 | Hirao et al. | |
| 6,236,587 B1 | 5/2001 | Gudesen et al. | |
| 6,340,588 B1 | 1/2002 | Nova et al. | |
| 6,380,597 B1 | 4/2002 | Gudesen et al. | |
| 6,509,217 B1 | 1/2003 | Reddy | |
| 6,528,815 B1 | 3/2003 | Brown et al. | |

(Continued)

FOREIGN PATENT DOCUMENTS

JP        06-232271       8/1994

(Continued)

OTHER PUBLICATIONS

"RFID Tags Become Target for Hacker," http://japan.cnet.com/news/sec/story/0,2000056024,20070122,00.htm., Jul. 29, 2004.

*Primary Examiner*—Phuc T Dang
(74) *Attorney, Agent, or Firm*—Eric J. Robinson; Robinson Intellectual Property Law Office, P.C.

(57) ABSTRACT

A memory device capable of data writing at a time other than during manufacturing is provided by using a memory element including an organic material. In a memory cell, a third conductive film, an organic compound, and a fourth conductive film are stacked over a semiconductor film provided with an n-type impurity region and a p-type impurity region, and a pn-junction diode is serially connected to the memory element. A logic circuit for controlling the memory cell includes a thin film transistor. The memory cell and the logic circuit are manufactured over one substrate at the same time. The n-type impurity region and the p-type impurity region of the memory cell are manufactured at the same time as the impurity region of the thin film transistor.

7 Claims, 32 Drawing Sheets

U.S. PATENT DOCUMENTS

| | | |
|---|---|---|
| 6,541,294 B1 * | 4/2003 | Yamazaki et al. ............. 438/29 |
| 6,683,322 B2 | 1/2004 | Jackson et al. |
| 6,683,802 B2 | 1/2004 | Katoh |
| 6,795,339 B2 | 9/2004 | Ooishi |
| 6,809,952 B2 | 10/2004 | Masui |
| 6,828,685 B2 | 12/2004 | Stasiak |
| 6,847,047 B2 | 1/2005 | Vanbuskirk et al. |
| 6,847,541 B2 | 1/2005 | Tsujioka |
| 6,852,997 B2 * | 2/2005 | Yamazaki et al. ............. 257/40 |
| 6,950,331 B2 | 9/2005 | Yang et al. |
| 6,962,844 B2 | 11/2005 | Stasiak |
| 6,977,389 B2 | 12/2005 | Tripsas et al. |
| 7,016,222 B2 | 3/2006 | Morikawa |
| 7,050,326 B2 | 5/2006 | Anthony |
| 7,220,985 B2 | 5/2007 | Cheung et al. |
| 7,359,230 B2 | 4/2008 | Sumida et al. |
| 7,499,305 B2 | 3/2009 | Nomura et al. |
| 2003/0156449 A1 | 8/2003 | Ooishi |
| 2003/0183699 A1 | 10/2003 | Masui |
| 2003/0227793 A1 | 12/2003 | Tsujioka |
| 2003/0230746 A1 | 12/2003 | Stasiak |
| 2004/0057323 A1 | 3/2004 | Tanabe |
| 2004/0130939 A1 | 7/2004 | Morikawa |
| 2004/0164302 A1 | 8/2004 | Arai et al. |
| 2005/0017370 A1 | 1/2005 | Stasiak |
| 2005/0174875 A1 | 8/2005 | Katoh |
| 2006/0121670 A1 | 6/2006 | Stasiak |
| 2006/0214008 A1 * | 9/2006 | Asami et al. ................ 235/492 |
| 2006/0267068 A1 | 11/2006 | Sato et al. |
| 2007/0153565 A1 | 7/2007 | Nomura et al. |
| 2007/0194301 A1 | 8/2007 | Sezi et al. |
| 2007/0230235 A1 | 10/2007 | Abe et al. |
| 2008/0048180 A1 | 2/2008 | Abe et al. |
| 2008/0123396 A1 | 5/2008 | Kato et al. |
| 2008/0210928 A1 | 9/2008 | Abe et al. |
| 2009/0121874 A1 | 5/2009 | Nomura et al. |

FOREIGN PATENT DOCUMENTS

| | | |
|---|---|---|
| JP | 2001-189431 | 7/2001 |
| JP | 2001-516964 | 10/2001 |
| JP | 2001-345431 | 12/2001 |
| JP | 2004-047791 | 2/2004 |
| WO | WO 2004/015778 | 2/2004 |

* cited by examiner

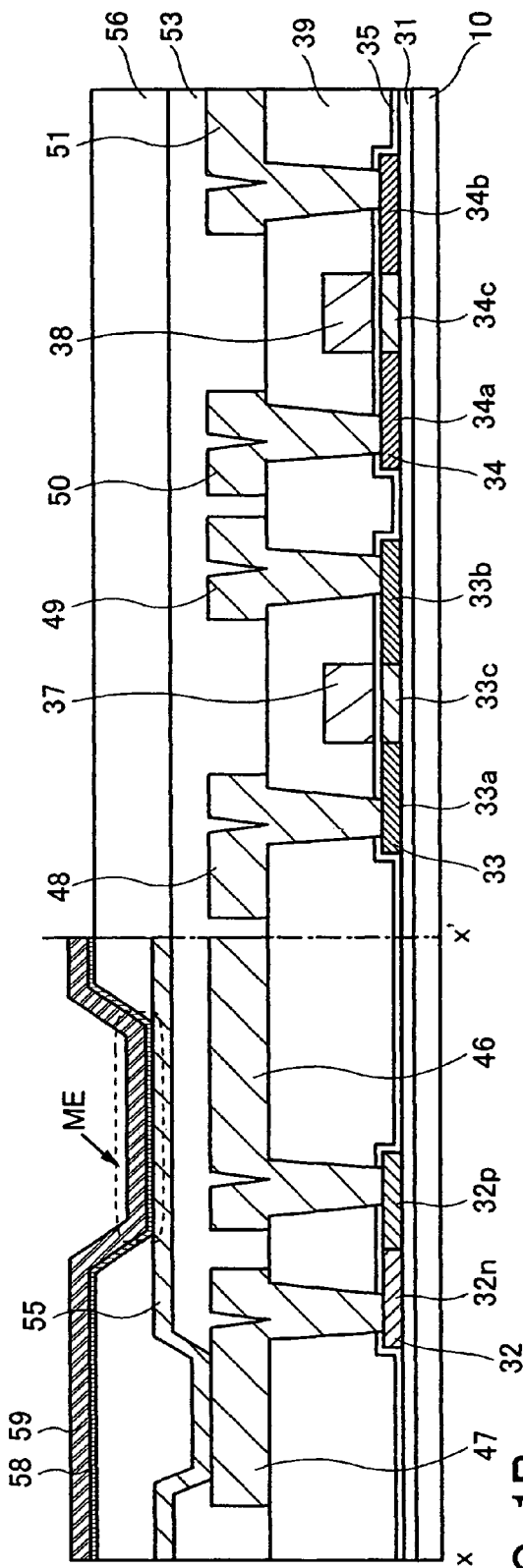
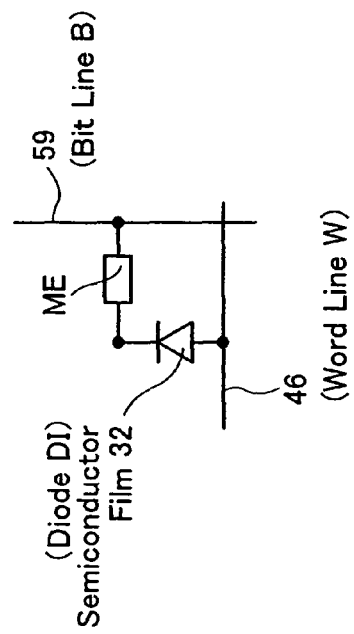
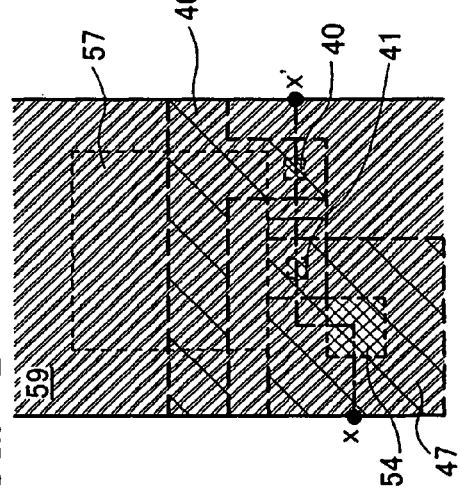

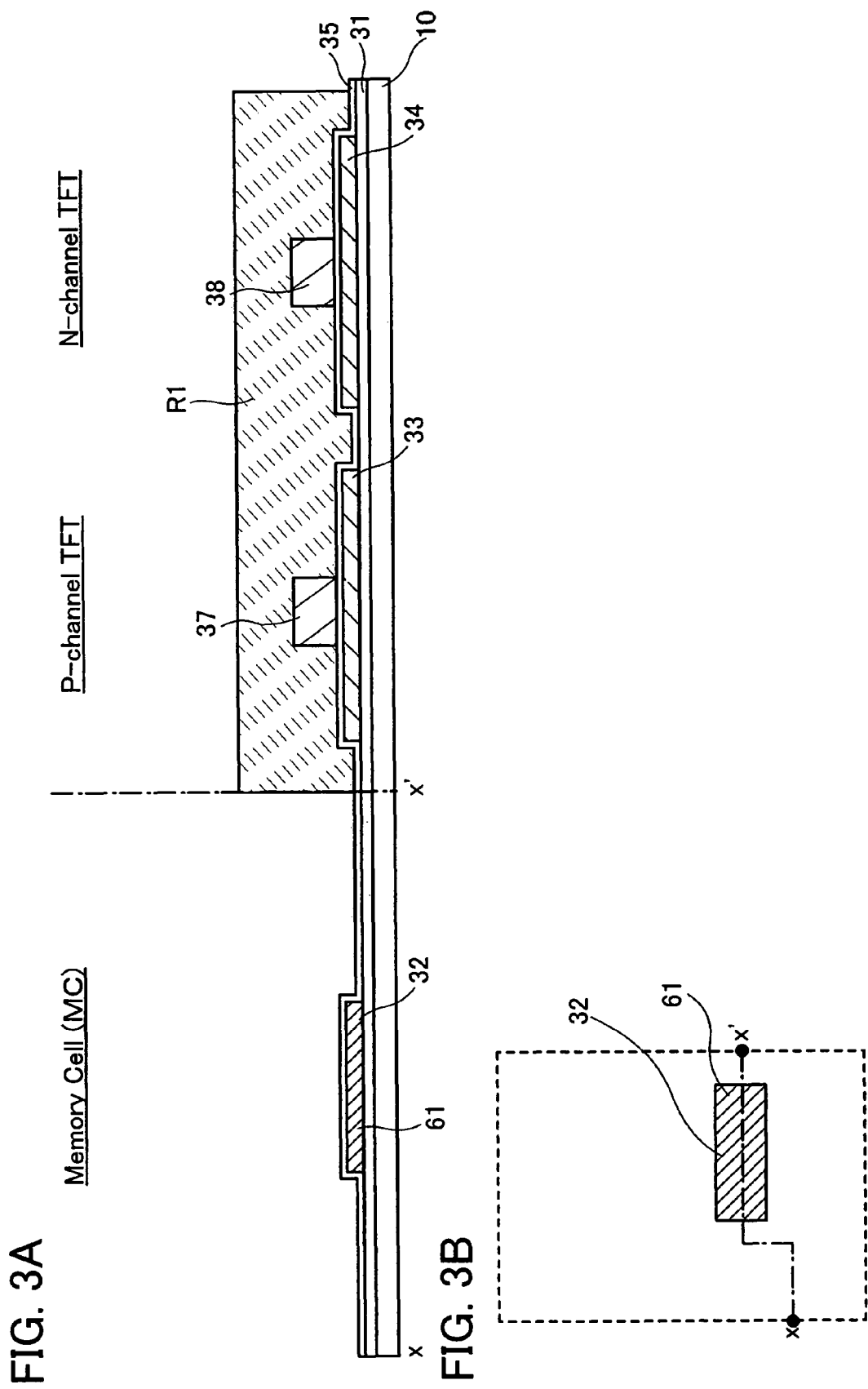

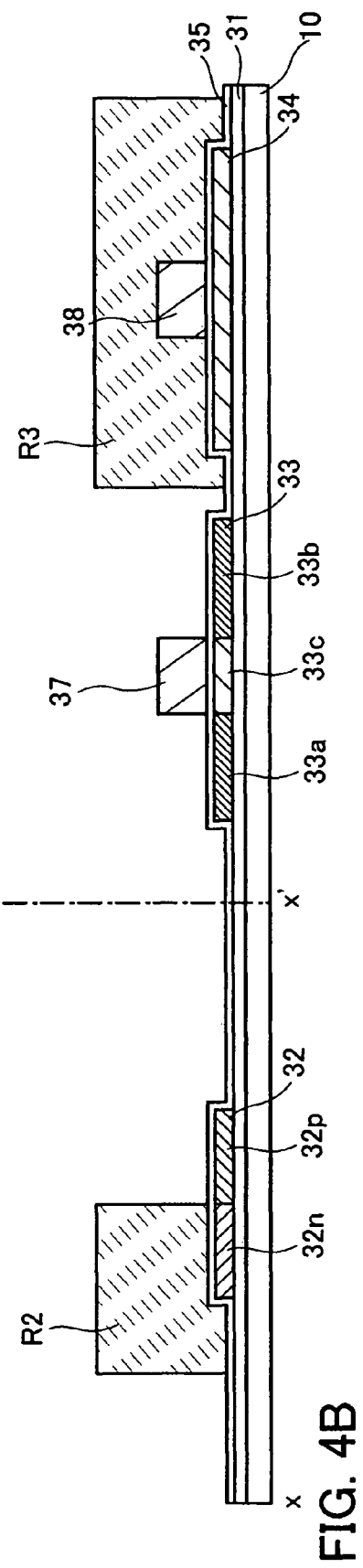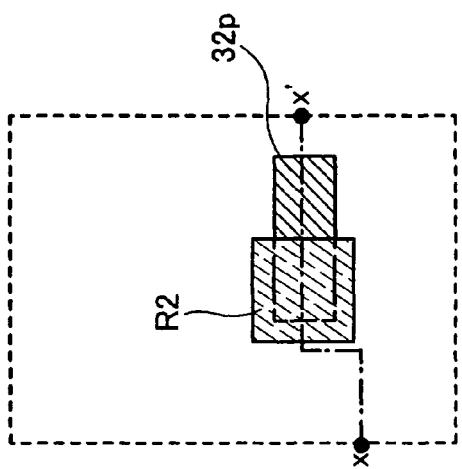
FIG. 4A
FIG. 4B

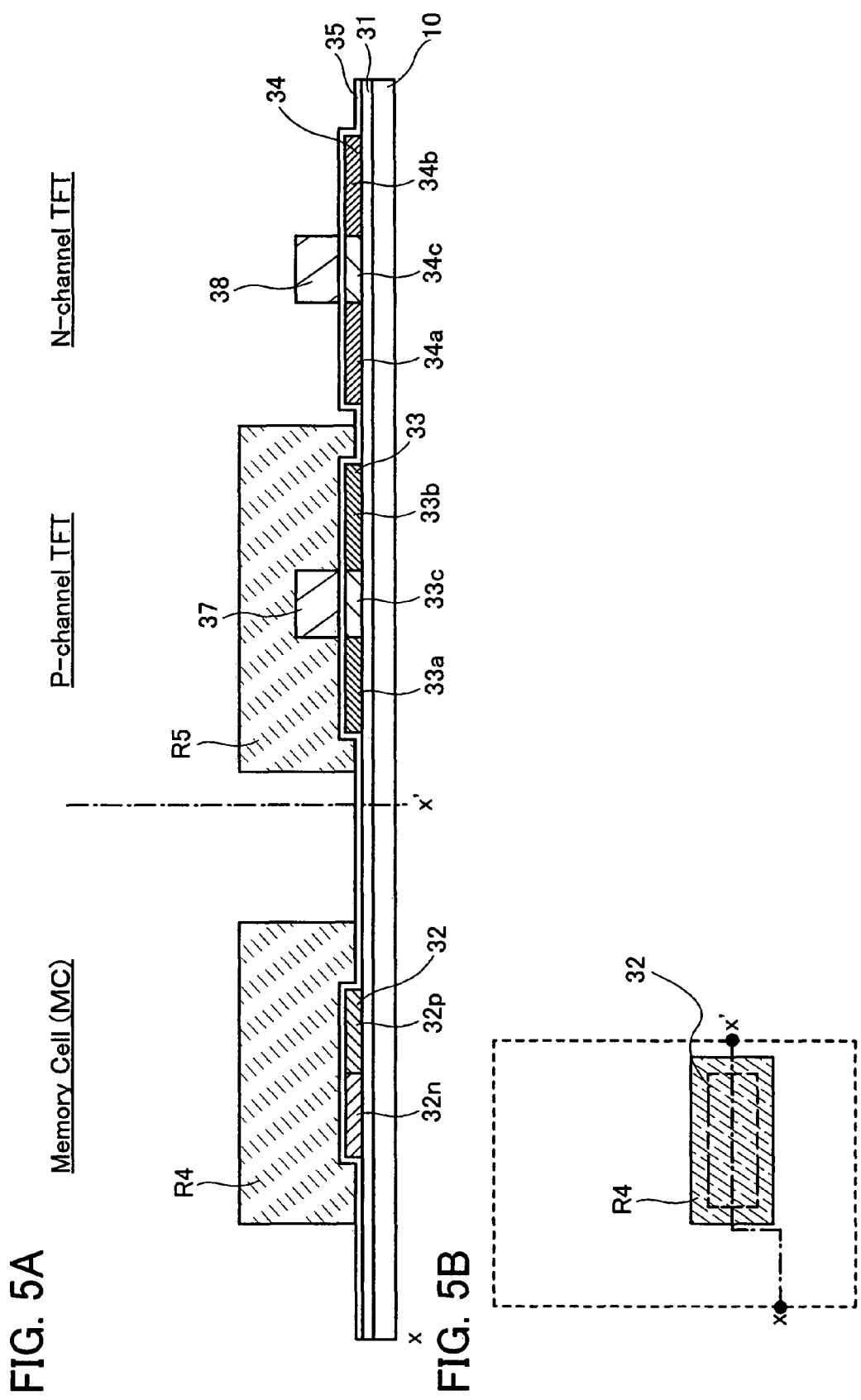

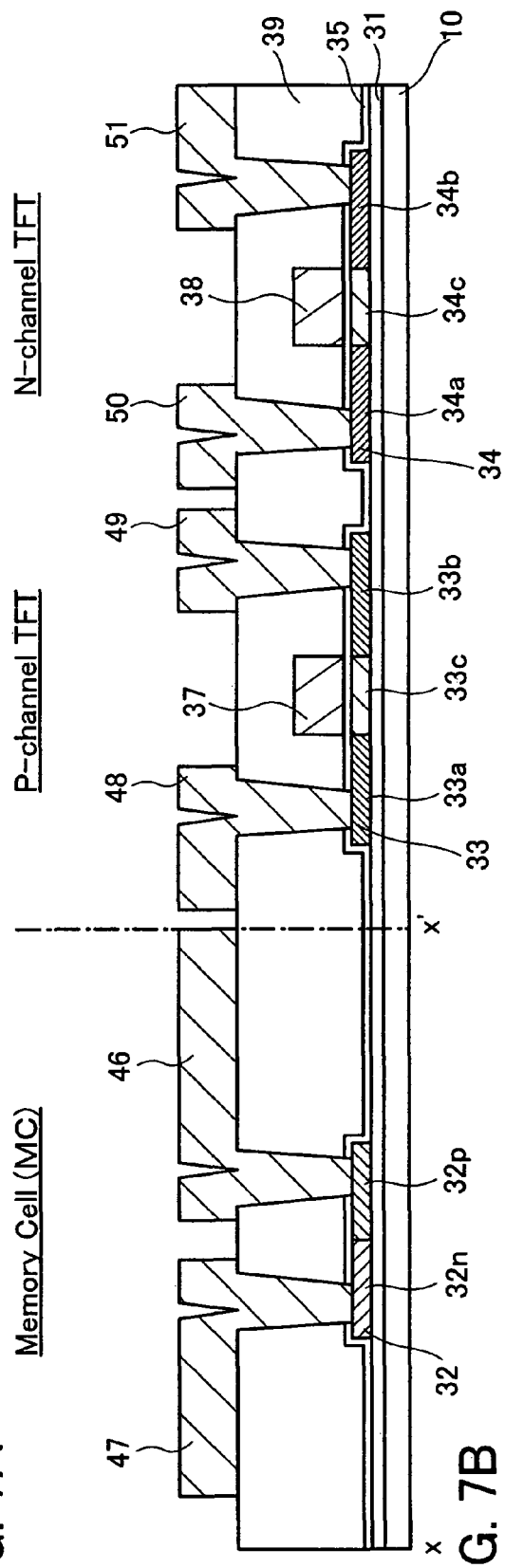
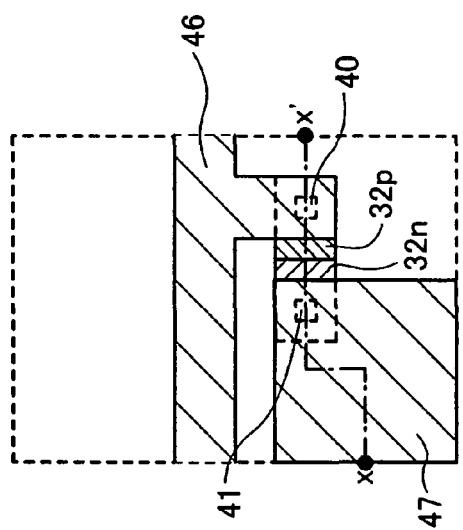
FIG. 7A
FIG. 7B

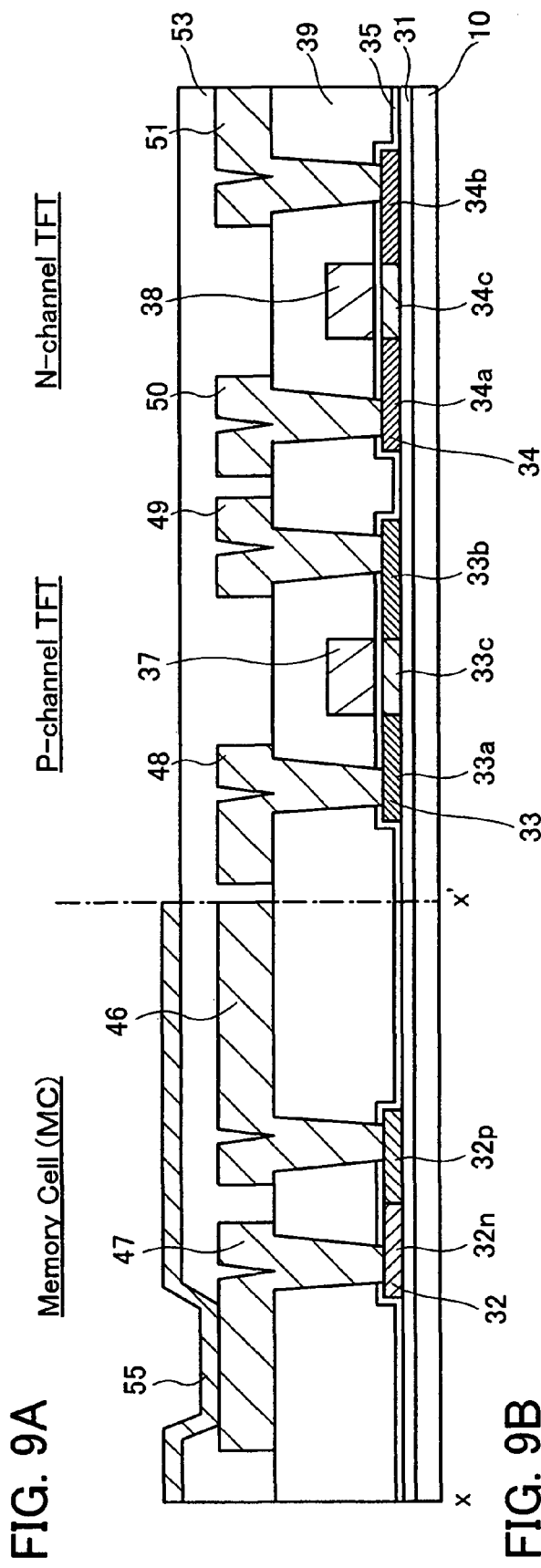
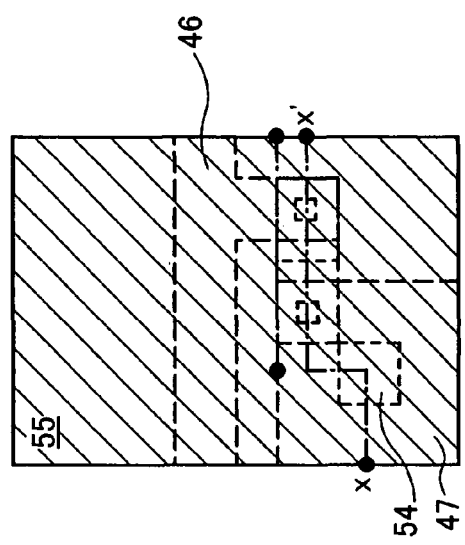
FIG. 9A
FIG. 9B

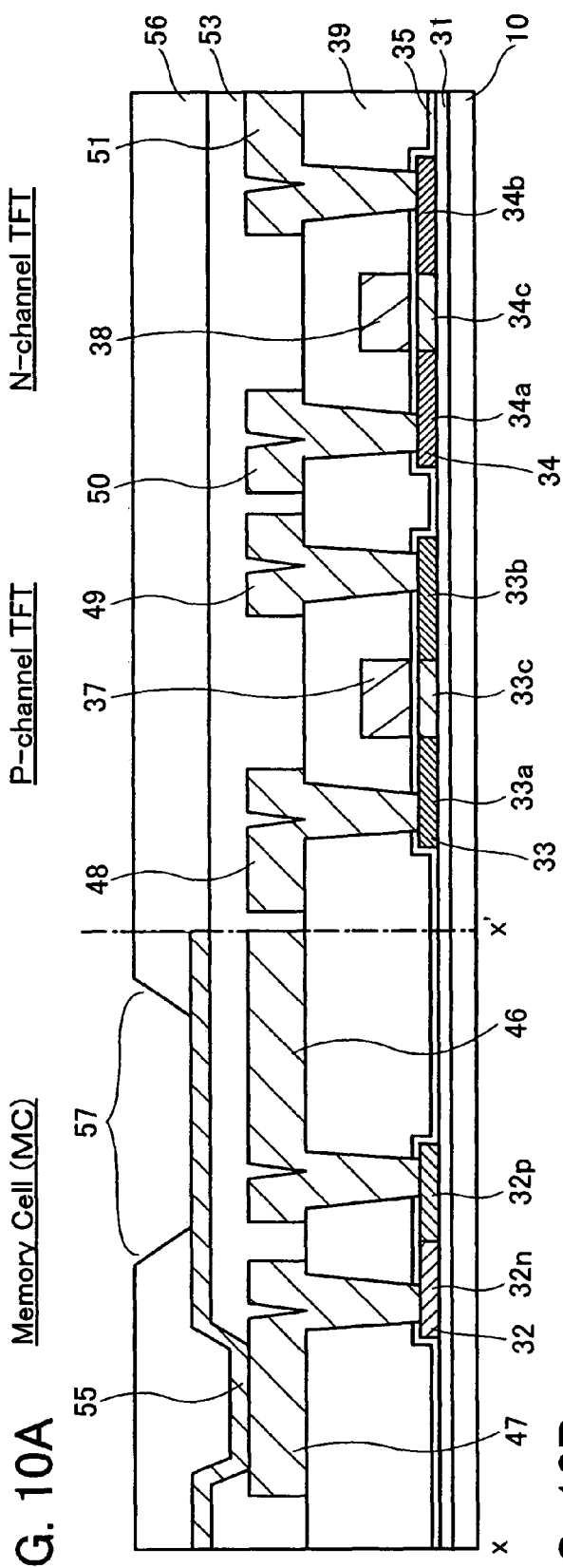

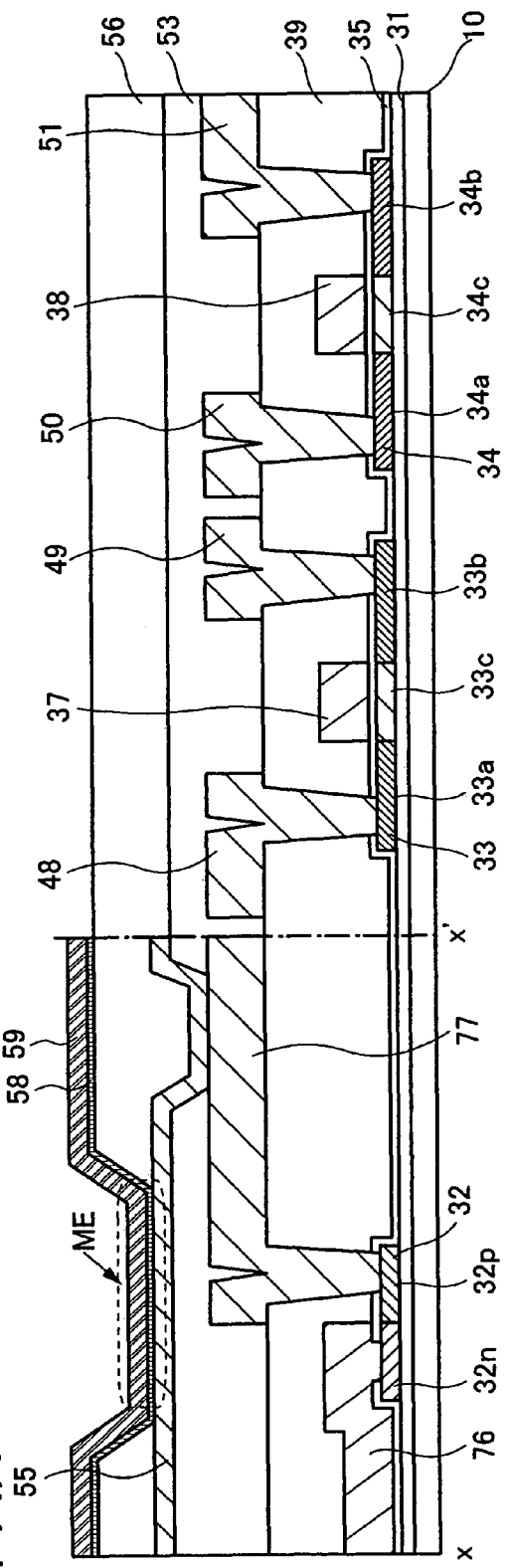
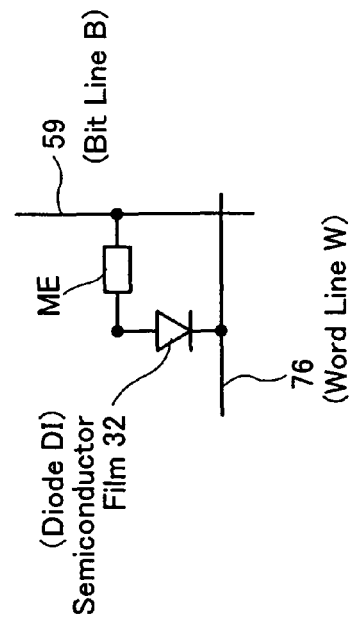
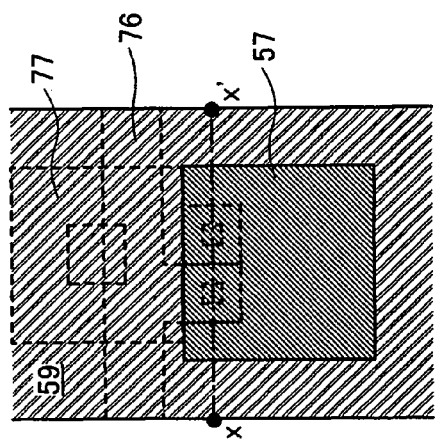
FIG. 14A
FIG. 14B
FIG. 14C

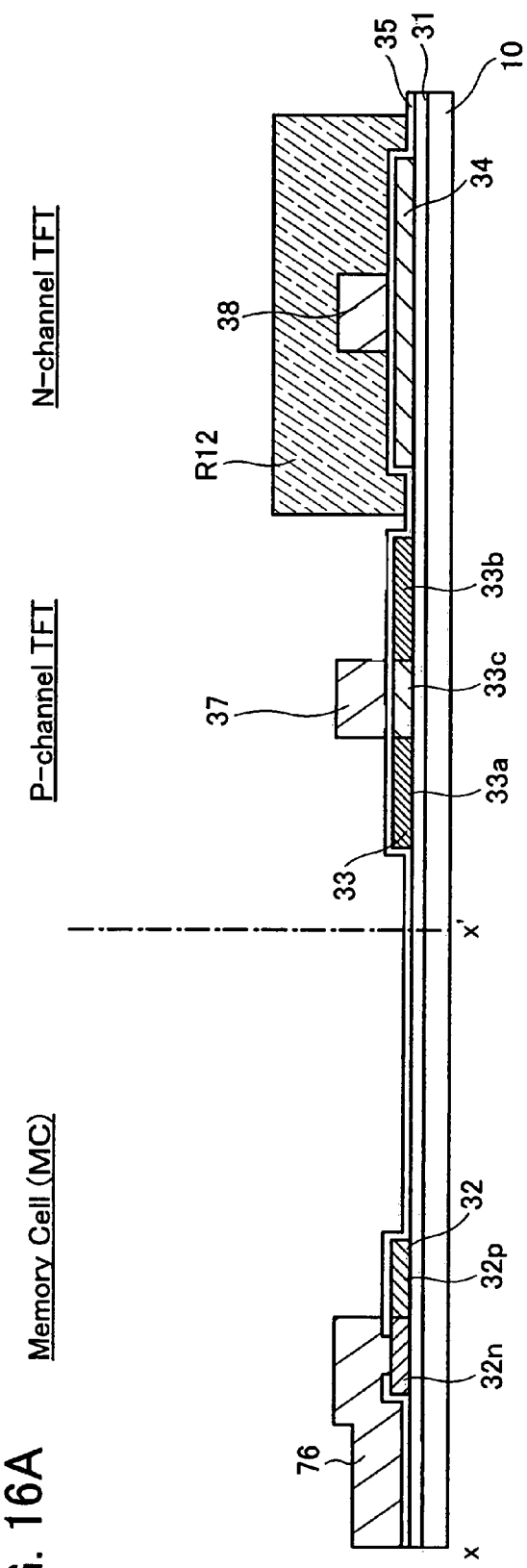
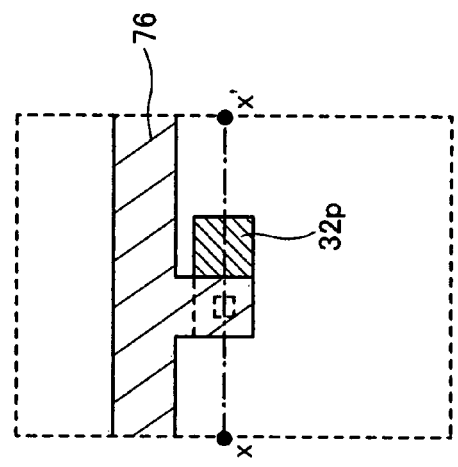
FIG. 16A
FIG. 16B

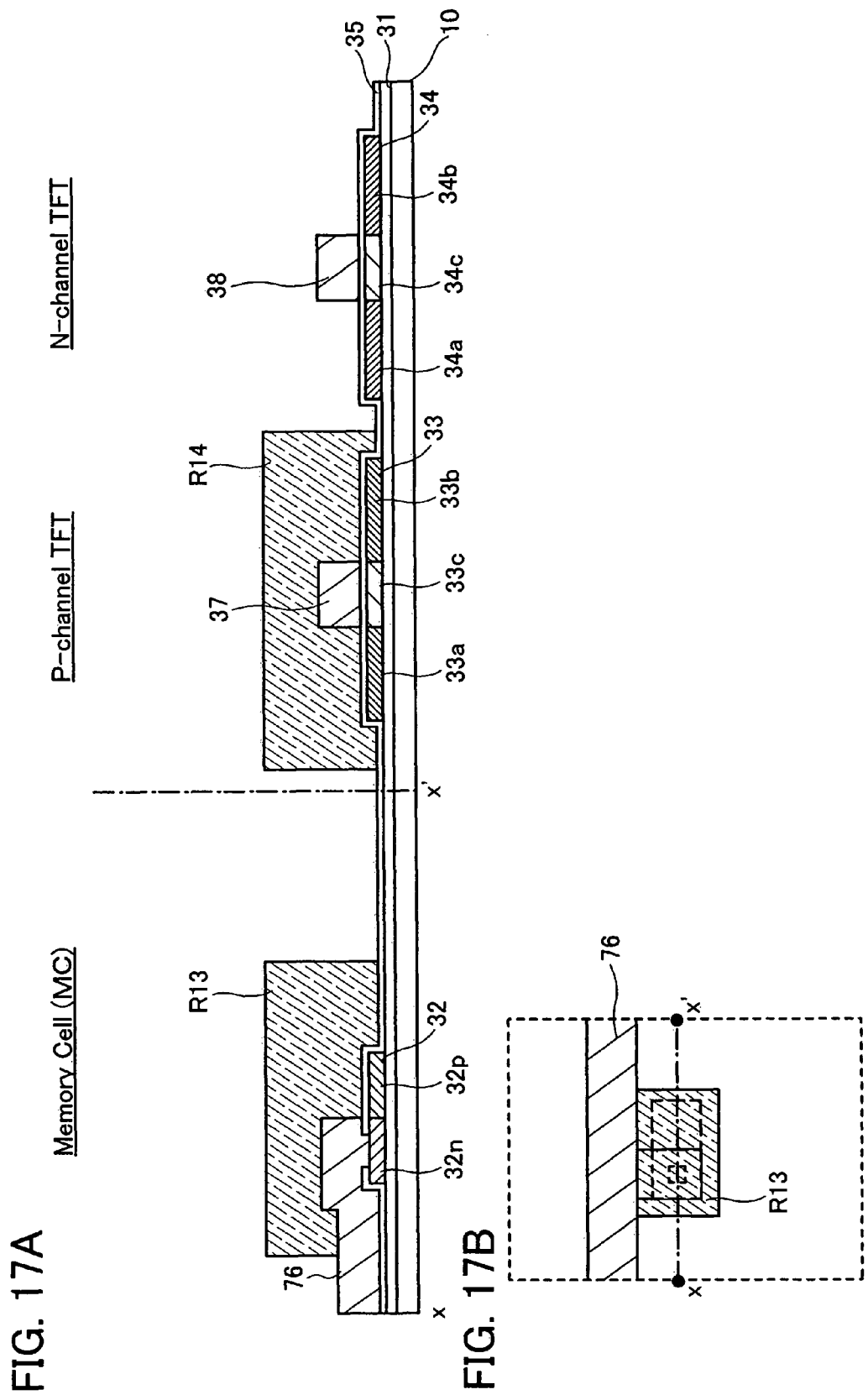

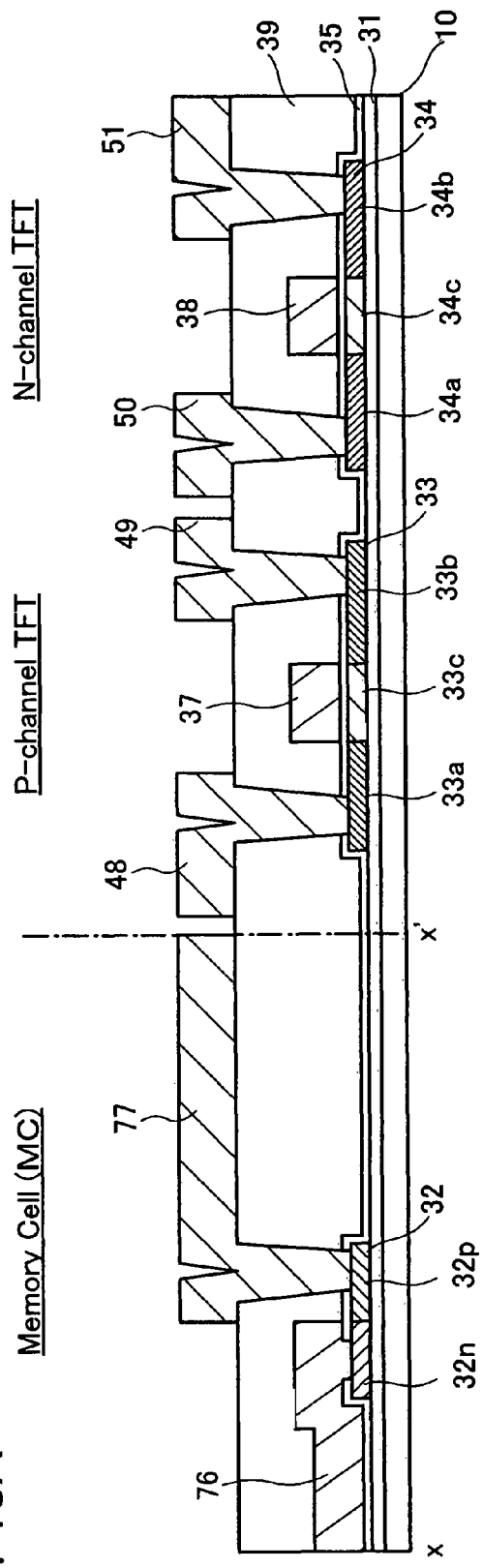

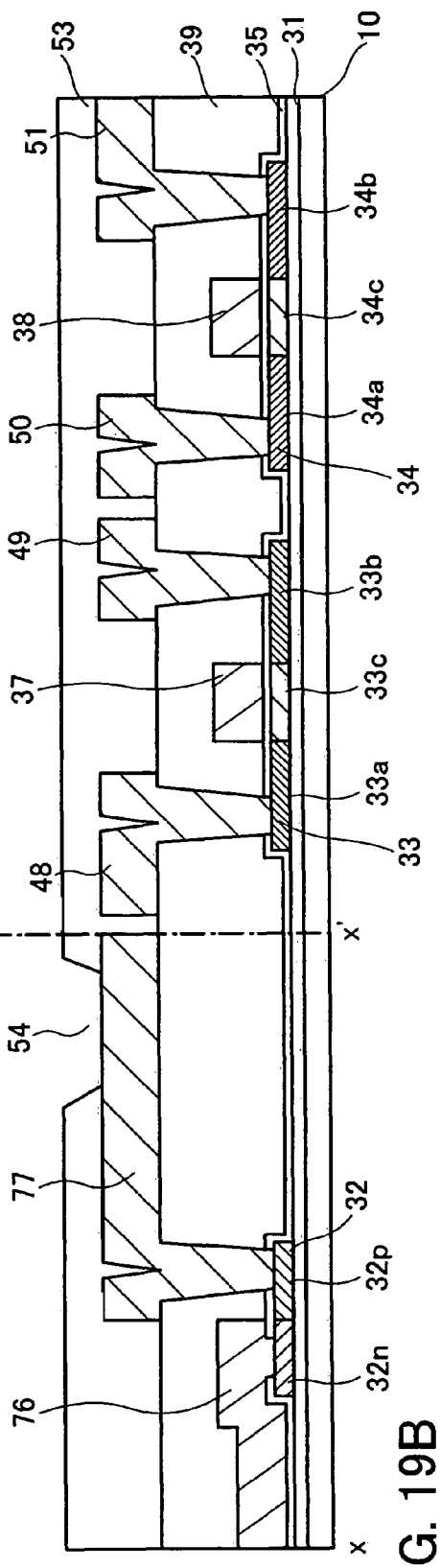
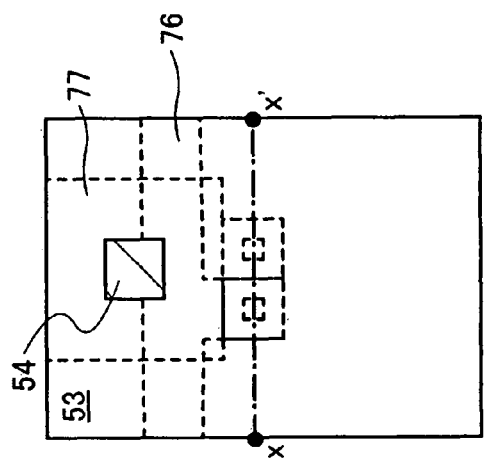
FIG. 19A
FIG. 19B

Comparative Example

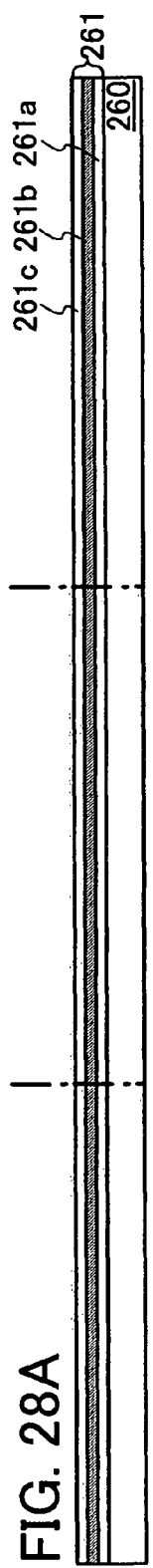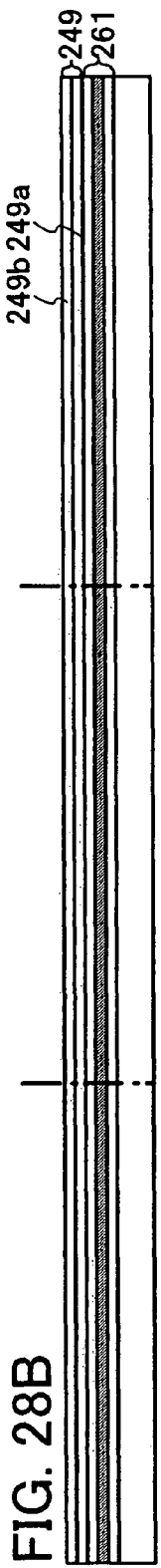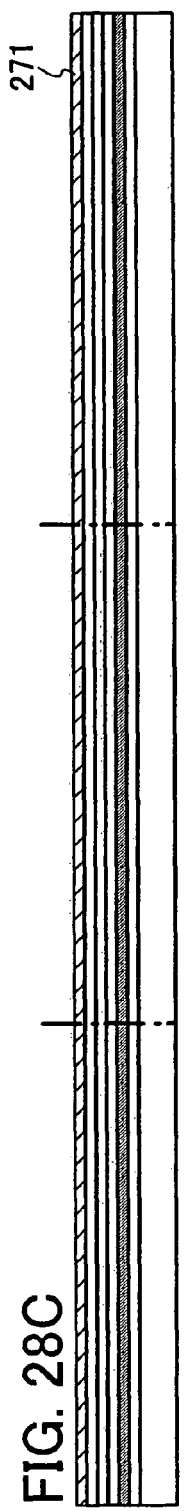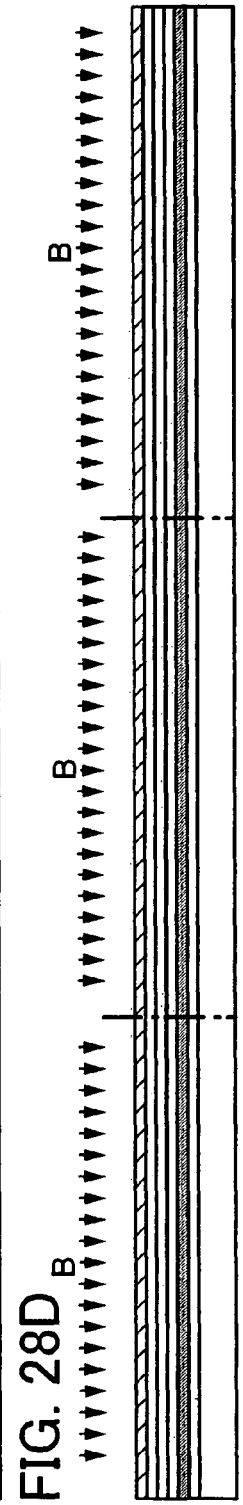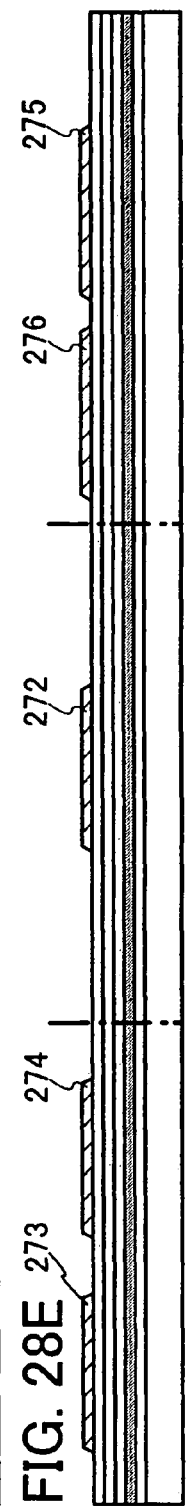

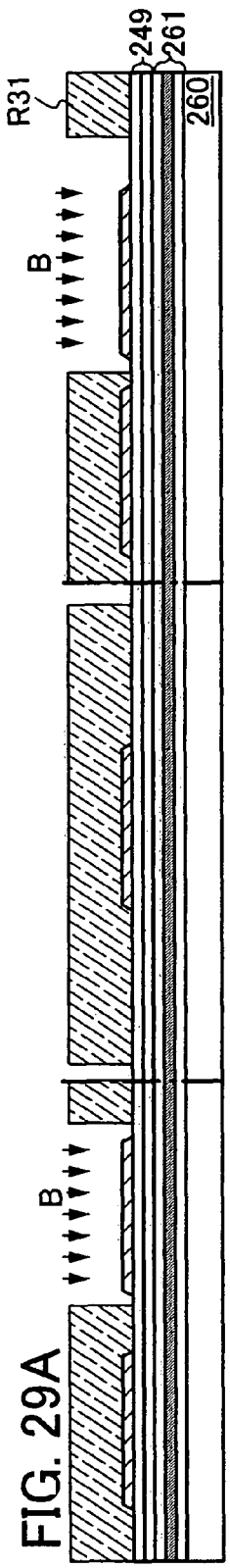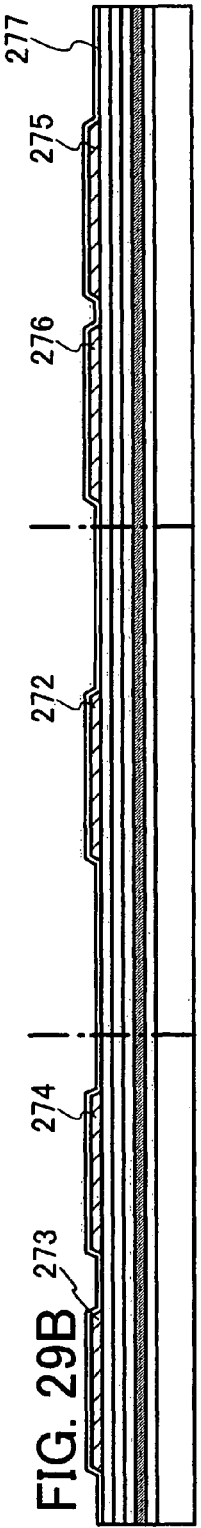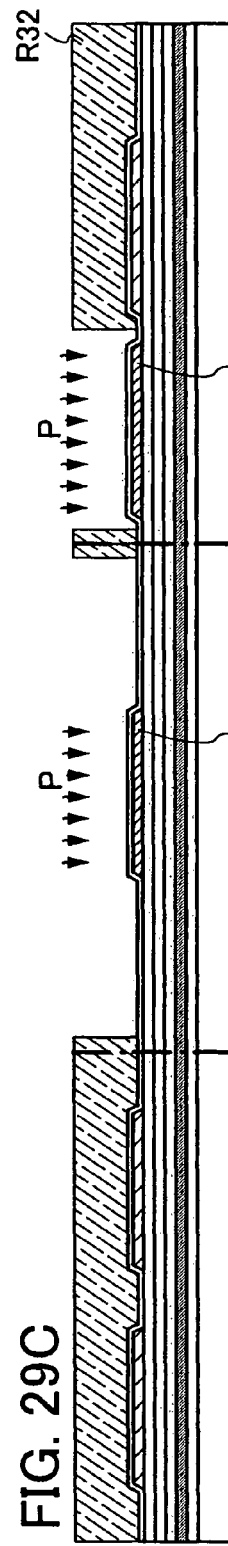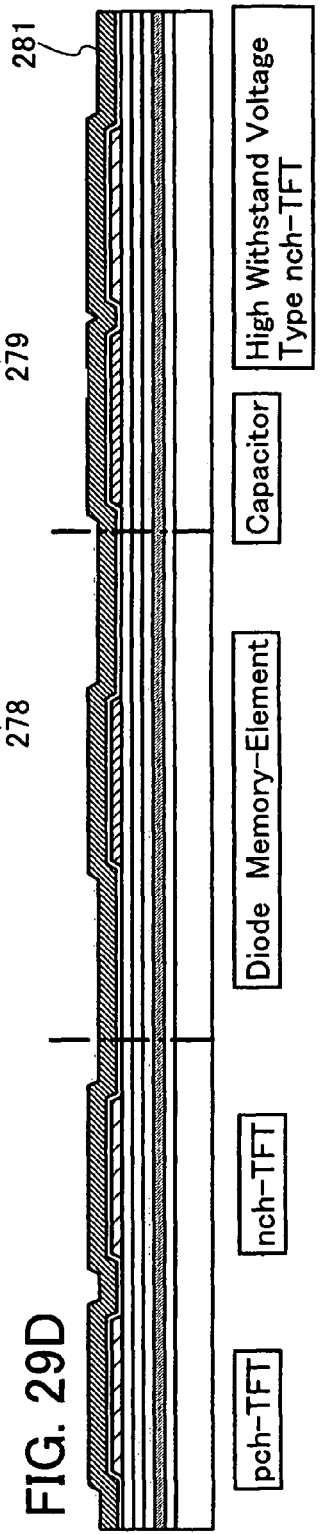

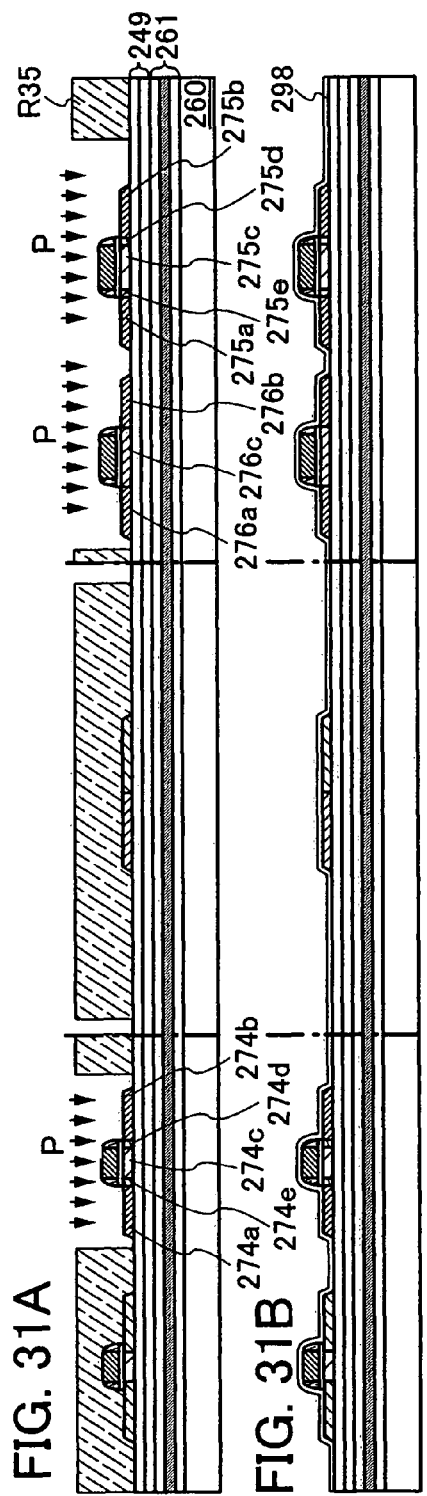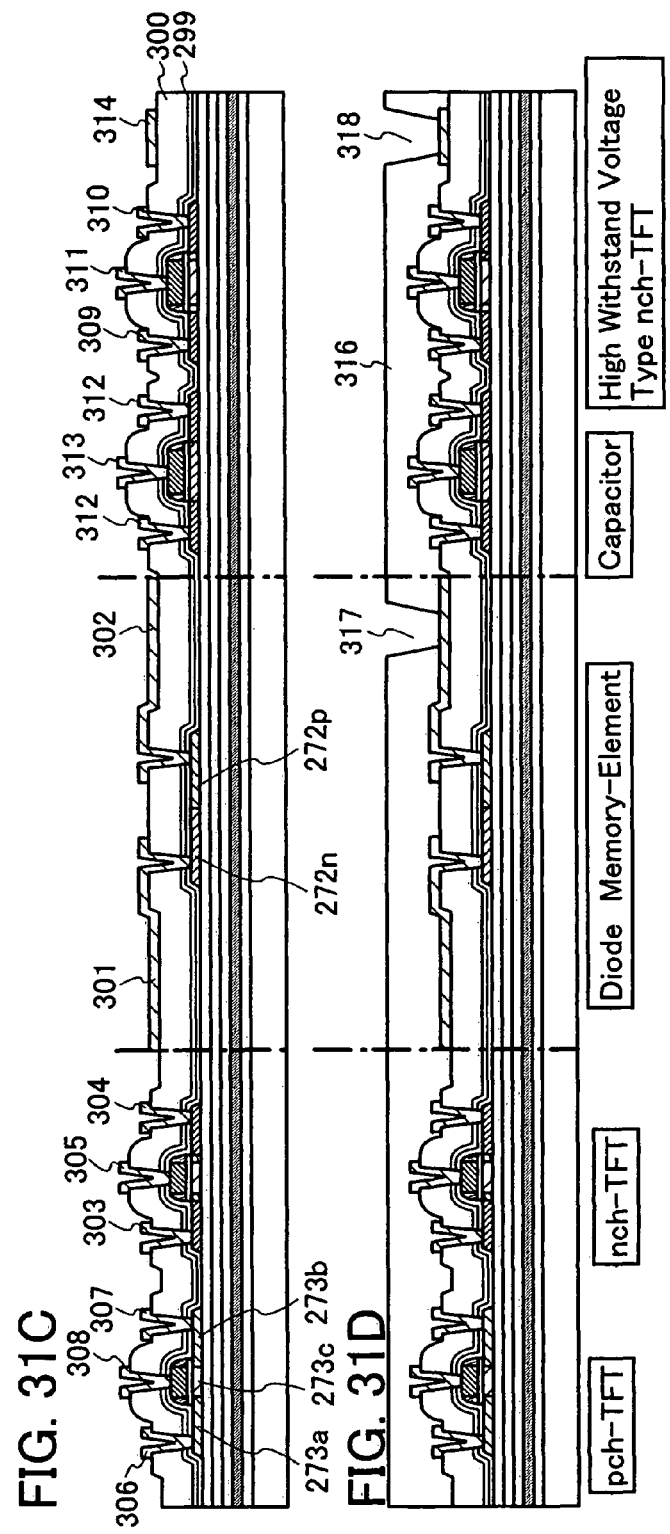
FIG. 31A
FIG. 31B
FIG. 31C
FIG. 31D

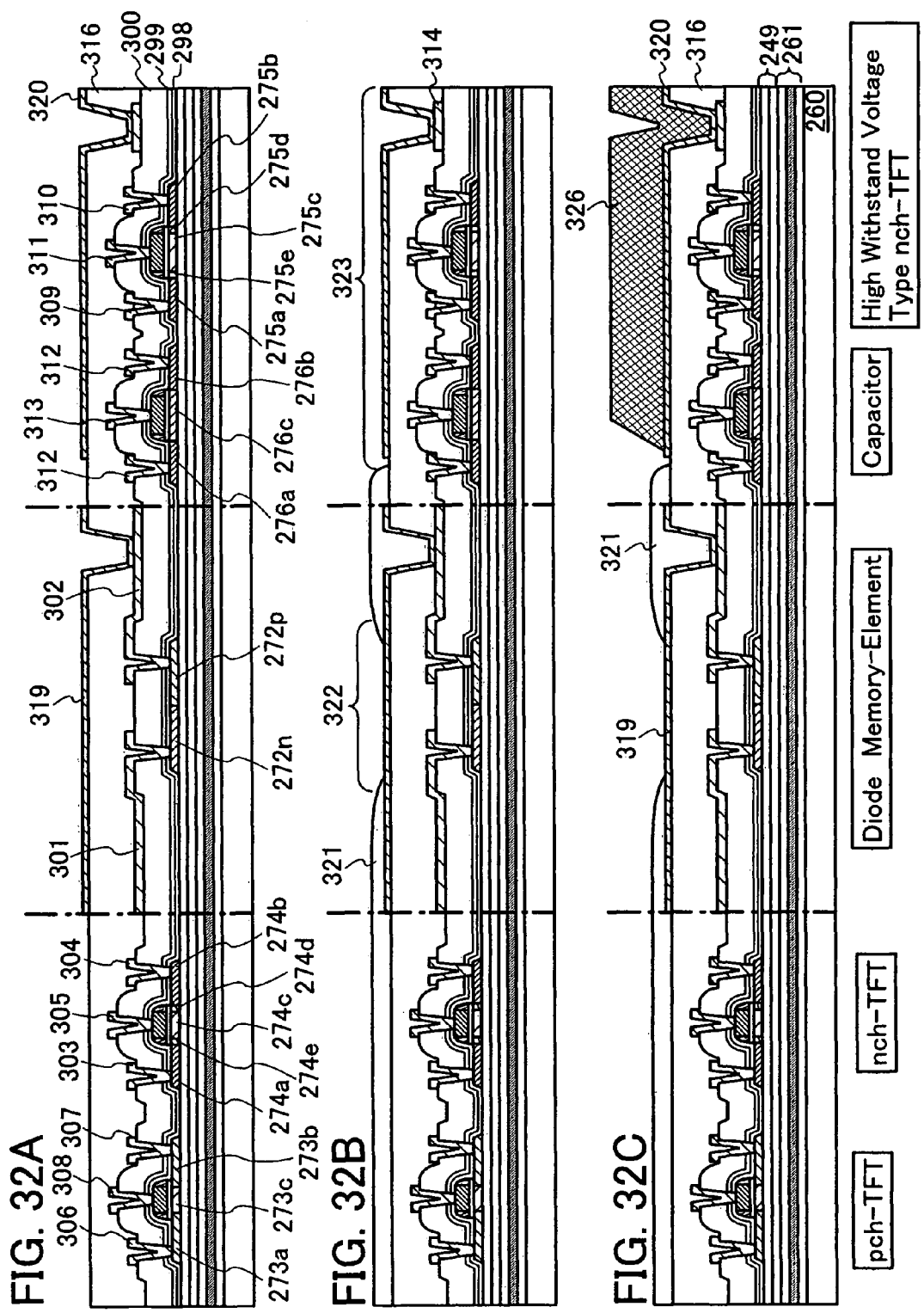

MEMORY DEVICE AND SEMICONDUCTOR DEVICE

BACKGROUND OF THE INVENTION

1. Field of the Invention

The present invention relates to a memory device using a memory element, and a semiconductor device provided with the memory device. In particular, the present invention relates to a device which uses an organic material for a memory element, and the like.

2. Description of the Related Art

In recent years, researches have been actively conducted on electronic elements using an organic material, such as an organic transistor and an organic memory. Electronic elements using an organic material are flexible, and expected as inexpensive elements. For example, Reference 1 (Japanese Translation of PCT International Application No. 2001-516964) describes a mask ROM using an organic diode. In a memory element according to Reference 1, data cannot be written (additionally recorded) at a time other than during manufacturing, which is inconvenient.

A semiconductor device called a compact IC (Integrated Circuit) chip capable of transmitting and receiving data wirelessly by providing an antenna has already been put into practical use. Such a semiconductor device is also referred to as, in addition to an IC chip, a wireless chip, an ID tag, an IC tag, an RF (Radio Frequency) tag, a wireless tag, a wireless IC tag, an electronic tag, or an RFID (Radio Frequency IDentification) tag.

By providing a memory device for storing a large amount of data in an IC chip, higher performance and higher added value can be realized. In order to expand use range of IC chips, cost reduction of IC chips is demanded. Cost reduction of IC chips is expected by using an organic memory for a memory device. However, Reference 1 does not disclose anything about integration with a circuit for controlling writing, reading, and the like of a memory element while making use of features of organic memories.

SUMMARY OF THE INVENTION

In view of the above problem, it is an object of the present invention to provide a memory device using an organic material, in which data can also be written at a time other than during manufacturing. It is another object of the present invention to increase capacity of a memory device.

It is another object of the present invention to provide a memory device and a semiconductor device of high performance and high added value by incorporating an element using an organic material into a circuit using a semiconductor material typified by silicon by a simple method.

A memory device of the present invention includes a memory cell array having a plurality of memory cells, a circuit for writing data in the memory cell array, and a circuit for reading data from the memory cell array. The memory cell includes a semiconductor film having an n-type impurity region and a p-type impurity region that are bonded with each other, a first conductive film which is formed over the semiconductor film and which is connected to one of the n-type impurity region and the p-type impurity region, a second conductive film which is formed over the first conductive film, and an organic compound layer interposed between the first conductive film and the second conductive film. That is to say, the memory cell has a structure in which an organic memory using the organic compound layer is stacked over a pn-junction diode.

A memory device of the present invention includes a reading circuit for reading data, a logic circuit for writing, an n-channel thin film transistor, and a p-channel thin film transistor. In the present invention, the semiconductor film of the memory cell and semiconductor films of the thin film transistors are formed over the same insulating surface.

In the present invention, in order to form pn junction in the semiconductor film of the memory cell, the p-type impurity region and the n-type impurity region are arranged in the same semiconductor film over the same insulating surface, instead of having a two-layer structure in which a p-type semiconductor film and an n-type semiconductor film are stacked. The pn-junction surface of the memory cell is formed not in parallel with the insulating surface but perpendicularly to the insulating surface. That is, the pn-junction surface is formed in parallel with a surface at which a channel formation region and an impurity region of a thin film transistor are bonded with each other. Therefore, pn-junction can be formed in the semiconductor film of the memory cell in a sequence of steps for forming impurity regions in the semiconductor film of the thin film transistor.

In the semiconductor film of the memory cell, at least one of the impurity regions that form pn-junction includes an n-type impurity or a p-type impurity at the same concentration as the impurity region formed in the semiconductor film of the thin film transistor. Moreover, an impurity is added to at least one of the impurity regions for forming pn-junction, by the same step of adding the impurity as the impurity region formed in the semiconductor film of the thin film transistor. Therefore, the memory cell and the thin film transistor may have impurity regions having the same sheet resistance.

The two impurity regions formed by the same step inevitably have different concentration, concentration distribution, and resistance values depending on the accuracy of a manufacturing apparatus. Therefore, in the present invention, similar concentration and the like between the two impurity regions include a case of complete match and moreover include margin of error due to the accuracy of a manufacturing apparatus. The impurity concentration of the semiconductor film can be determined by the peak concentration of concentration distribution (concentration profile).

The memory device of the present invention is suitable for a memory portion of a semiconductor device capable of inputting and outputting data without contact by an antenna. In such a semiconductor device, a resonance circuit having a capacitor is connected to the antenna for wireless communication. When the capacitor has an MIS structure, a diode of the memory cell, the thin film transistor, and the capacitor can be formed at the same time. Therefore, the impurity region of the memory cell and any of impurity regions of the capacitor can be manufactured by the same step of adding the impurity.

When the memory cell is provided with pn junction, data can also be written in the memory cell at a time other than during manufacturing of a memory device using an organic material. Thus, by the use of the memory device of the present invention, cost reduction of a high-value-added semiconductor device such as a wireless chip is possible.

The pn junction of the memory cell of the present invention can be manufactured at the same time as a thin film transistor of a logic circuit for controlling the memory cell and moreover without adding special steps to the manufacturing steps of the thin film transistor. Accordingly, since conventional assets for manufacturing thin film transistors can be used without any change, the present invention is very effective industrially.

BRIEF DESCRIPTION OF DRAWINGS

In the accompanying drawings:

FIG. 1A shows a cross-sectional structure of a part of a memory device and shows a cross section along a line x-x' of FIG. 1B, FIG. 1B shows a top view of a memory cell MC, and FIG. 1C shows an equivalent circuit diagram of the memory cell MC in FIG. 1B (Embodiment Mode 1);

FIG. 3A shows a cross-sectional structure of a part of a memory device for explaining a method for manufacturing a memory device, and FIG. 3B shows a top-surface structure of a memory cell for explaining a method for manufacturing a memory device (Embodiment Mode 1);

FIG. 4A shows a cross-sectional structure of a part of a memory device for explaining a method for manufacturing a memory device, and FIG. 4B shows a top-surface structure of a memory cell for explaining a method for manufacturing a memory device (Embodiment Mode 1);

FIG. 5A shows a cross-sectional structure of a part of a memory device for explaining a method for manufacturing a memory device, and FIG. 5B shows a top-surface structure of a memory cell for explaining a method for manufacturing a memory device (Embodiment Mode 1);

FIG. 7A shows a cross-sectional structure of a part of a memory device for explaining a method for manufacturing a memory device, and FIG. 7B shows a top-surface structure of a memory cell for explaining a method for manufacturing a memory device (Embodiment Mode 1);

FIG. 9A shows a cross-sectional structure of a part of a memory device for explaining a method for manufacturing a memory device, and FIG. 9B shows a top-surface structure of a memory cell for explaining a method for manufacturing a memory device (Embodiment Mode 1);

FIG. 10A shows a cross-sectional structure of a part of a memory device for explaining a method for manufacturing a memory device, and FIG. 10B shows a top-surface structure of a memory cell for explaining a method for manufacturing a memory device (Embodiment Mode 1);

FIG. 14A shows a cross-sectional structure of a part of a memory device and shows a cross section along a line x-x' of FIG. 14B, FIG. 14B shows a top view of a memory cell MC, and FIG. 14C shows an equivalent circuit diagram of the memory cell of FIG. 14B (Embodiment Mode 2);

FIG. 16A shows a cross-sectional structure of a part of a memory device for explaining a method for manufacturing a memory device, and FIG. 16B shows a top-surface structure of a memory cell for explaining a method for manufacturing a memory device (Embodiment Mode 2);

FIG. 17A shows a cross-sectional structure of a part of a memory device for explaining a method for manufacturing a memory device, and FIG. 17B shows a top-surface structure of a memory cell for explaining a method for manufacturing a memory device (Embodiment Mode 2);

FIG. 18A shows a cross-sectional structure of a part of a memory device for explaining a method for manufacturing a memory device, and FIG. 18B shows a top-surface structure of a memory cell for explaining a method for manufacturing a memory device (Embodiment Mode 2);

FIG. 19A shows a cross-sectional structure of a part of a memory device for explaining a method for manufacturing a memory device, and FIG. 19B shows a top-surface structure of a memory cell for explaining a method for manufacturing a memory device (Embodiment Mode 2);

FIG. 24B shows a top view in which FIG. 23 is reduced with the same reduction scale as FIG. 24A (Embodiment Mode 4);

FIGS. 28A to 28E show cross sections each explaining a process for manufacturing an element-forming layer of a semiconductor device (Embodiment 1);

FIGS. 29A to 29D show cross sections each explaining a process for manufacturing an element-forming layer of a semiconductor device (Embodiment 1);

FIGS. 31A to 31D show cross sections each explaining a process for manufacturing an element-forming layer of a semiconductor device (Embodiment 1);

FIGS. 32A to 32C show cross sections each explaining a process for manufacturing an element-forming layer of a semiconductor device (Embodiment 1)

DETAILED DESCRIPTION OF THE INVENTION

Figure 2A:
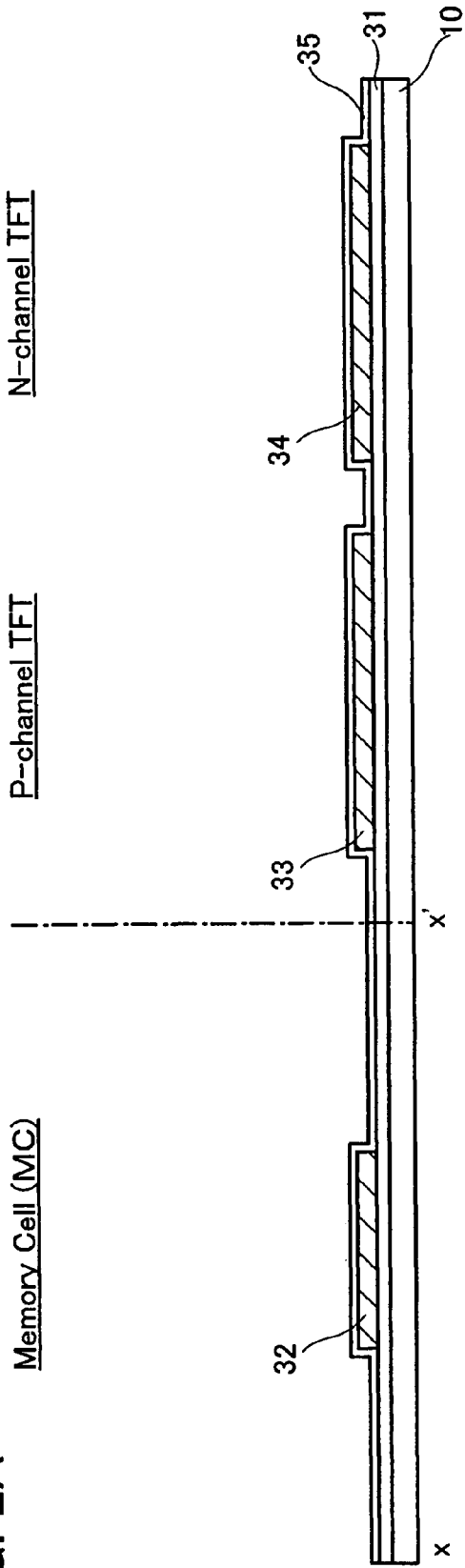
FIG. 2A shows a cross-sectional structure of a part of a memory device for explaining a method for manufacturing a memory device.

Embodiment modes and embodiments of the present invention are hereinafter explained with reference to the drawings. The same element is denoted with the same reference numeral and the redundant explanation is omitted. Moreover, the present invention can be implemented with many different modes, and it is easily understood by those skilled in the art that the mode and detail can be variously changed without departing from the scope and spirit of the present invention. Therefore, the present invention is not construed as being limited to the description of the embodiment modes and embodiments.

Embodiment Mode 1

This embodiment mode will explain a memory device as a semiconductor device having a memory element of the present invention.

Figure 11:
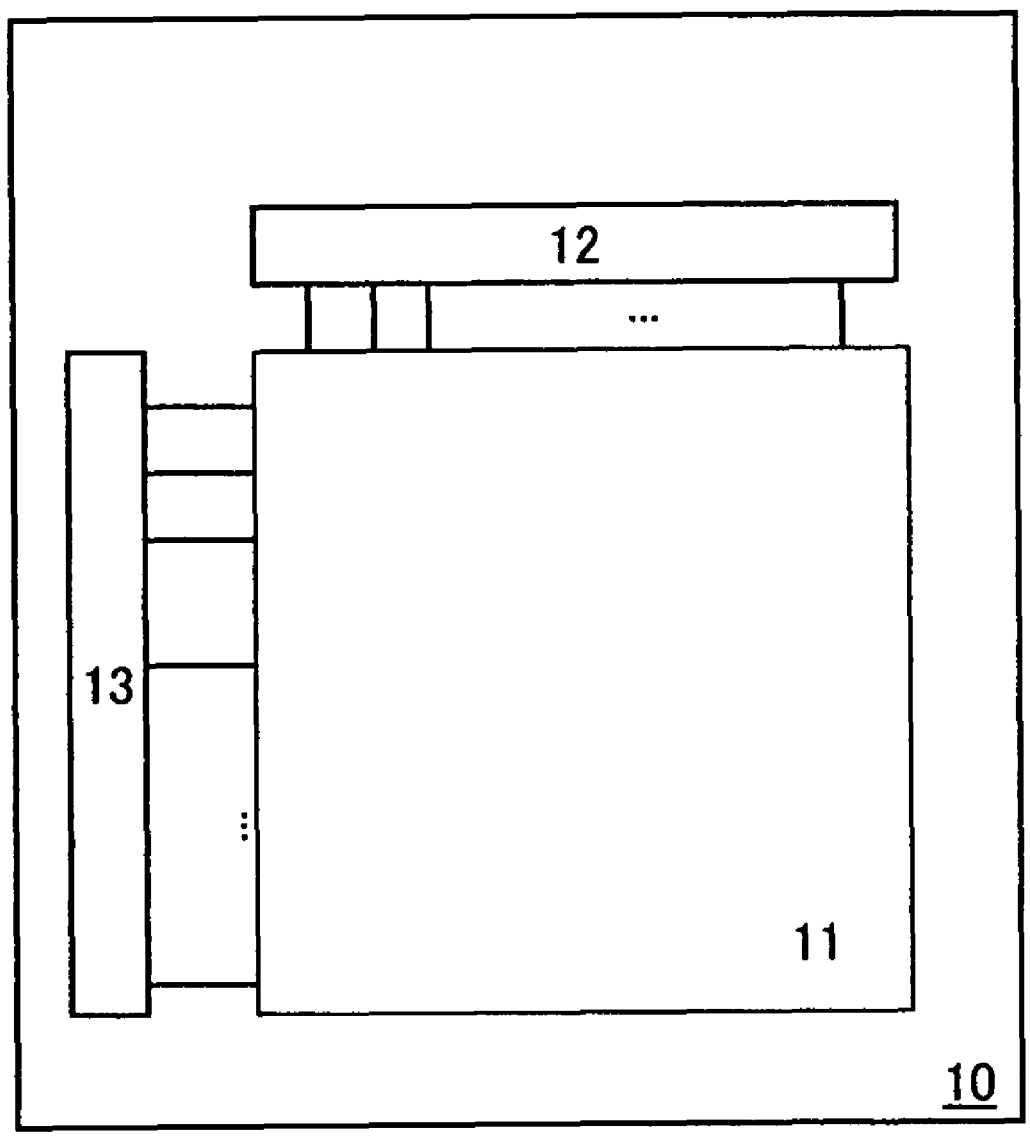
FIG. 11 is a block diagram showing a structure of a memory device (Embodiment Mode 1)

A structure example of the memory device is shown in FIG. 11. The memory device includes the following over a substrate 10: a memory cell array 11 having memory cells arranged in matrix; a word line driving circuit 12 having a decoder and the like; and a bit line driving circuit 13 having a decoder, a selector, a reading circuit, a writing circuit, and the like. The memory cell array 11 has memory cells of n rows×m columns. The word line driving circuit 12 is connected to the memory cell array 11 by n number of word lines Wh (h=1, 2, . . . , n), and the bit line driving circuit 13 is connected to the memory cell array 11 by m number of bit lines Bk (k=1, 2, . . . , m). The structure of the memory device shown in FIG. 11 is just an example, and the memory device may further include another circuit such as a sense amplifier, an output circuit, or a buffer over the substrate 10. By controlling the word line driving circuit 12 and the bit line driving circuit 13, data can be written in, or written data can be read from an arbitrary memory element ME in the memory cell array 11.

Figure 12:
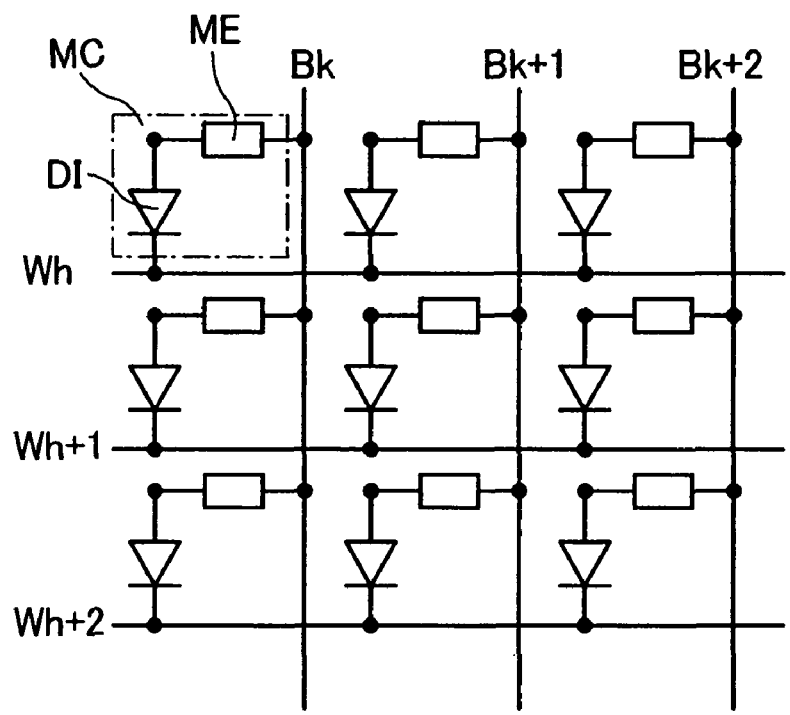
FIG. 12 is an equivalent circuit diagram of a memory cell array (Embodiment Mode 1)

FIG. 12 shows an example of an equivalent circuit diagram of a memory cell MC provided in the memory cell array 11. FIG. 12 shows memory cells MC of 3 rows×3 columns. Each memory cell MC includes a memory element ME and a diode DI connected serially to the memory element ME. The memory element ME is connected to the bit line Bk and the diode DI is connected to the word line Wh. The diode DI is connected in a direction from the memory element ME to the word line Wh in FIG. 12; however, this embodiment mode is not limited to this, and the diode DI may be connected in a direction from the word line Wh to the memory element ME. The relation between the bit line B and the word line W may be opposite.

Figure 13:
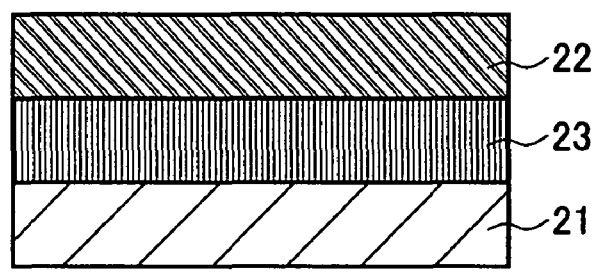
FIG. 13 shows a cross-sectional structure of a memory element (Embodiment Mode 1)

FIG. 13 shows a cross section of the memory element ME. The memory element ME has an organic compound layer 23 between a pair of conductive films 21 and 22. In the memory cell MC, one of the conductive films 21 and 22 is connected to the bit line B and the other is connected to the diode DI.

As an organic compound used for the organic compound layer 23, an organic compound of which crystal state, conductivity, and shape are changed by application of voltage is used. The organic compound layer 23 may be a single layer or a stack of layers formed of different organic compounds. The organic compound layer 23 may include an inorganic material in addition to the organic compound. Besides the organic compound layer 23, for example, a semiconductor film, an insulating layer, and the like may be provided between the pair of conductive films 21 and 22.

The organic compound layer 23 can be formed of an organic compound having a hole-transporting property or an electron-transporting property. As the organic compound having a hole-transporting property, for example, an aromatic amine compound (that is, a compound having a benzene ring—nitrogen bond), phthalocyanine (abbreviated to $H_2Pc$), or a phthalocyanine compound such as copper phthalocyanine (abbreviated to CuPc) or vanadyl phthalocyanine (abbreviated to VOPc) can be used. The aromatic amine compound is, for example, 2,7-di(N-carbazolyl)-spiro-9,9'-bifluorene (abbreviated to SFDCz); 4,4'-bis[N-(1-naphthyl)-N-phenylamino]biphenyl (abbreviated to NPB); 4,4'-bis[N-(3-methylphenyl)-N-phenyl-amino]-biphenyl (abbreviated to TPD); 4,4',4"-tris(N,N-diphenyl-amino)-triphenylamine (abbreviated to TDATA); 4,4',4"-tris[N-(3-methylphenyl)-N-phenyl-amino]-triphenylamine (abbreviated to MTDATA); 4,4'-bis{N-[4-(N,N-di-m-tolylamino)phenyl]-N-phenylamino}biphenyl (abbreviated to DNTPD); or the like.

The substances mentioned above as the examples of the organic compound having a hole-transporting property mainly have a hole mobility of $10^{-6}$ $cm^2/Vs$ to $10^{-2}$ $cm^2/Vs$.

As the organic compound having an electron-transporting property, the following material with a metal complex having a quinoline skeleton or a benzoquinoline skeleton, or the like can be used: tris(8-quinolinolato)aluminum (abbreviated to Alq), tris(4-methyl-8-quinolinolato)aluminum (abbreviated to $Almq_3$), bis(10-hydroxybenzo[h]-quinolinato)beryllium (abbreviated to $BeBq_2$), or bis(2-methyl-8-quinolinolato)-4-phenylphenolato-aluminum (abbreviated to BAlq). Besides those, a metal complex having an oxazole or thiazole ligand, such as bis[2-(2-hydroxyphenyl)benzoxazolato]zinc (abbreviated to $Zn(BOX)_2$) or bis[2-(2-hydroxyphenyl)benzothiazolato]zinc (abbreviated to $Zn(BTZ)_2$), or the like can be used.

In addition to the metal complex, the following organic compound having an electron-transporting property can be used: 2-(4-biphenylyl)-5-(4-tert-butylphenyl)-1,3,4-oxadiazole (abbreviated to PBD), 1,3-bis[5-p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like. The substances mentioned as the organic compound having an electron-transporting property mainly have an electron mobility of $10^{-6}$ $cm^2/Vs$ to $10^{-2}$ $cm^2/Vs$.

The memory device of this embodiment mode includes thin film transistors (hereinafter a thin film transistor is abbreviated as a TFT) as transistors for forming the word line driving circuit 12 and the bit line driving circuit 13 over the substrate 10. The diode DI of the memory cell MC is manufactured over the substrate 10 at the same time as the manufacturing of the TFTs.

FIG. 1A shows a schematic cross-sectional structure of the memory device of this embodiment mode. The left side of FIG. 1A shows a cross section of one memory cell MC as a cross section of a part of the memory cell array 11. The right side of FIG. 1A shows a part of a cross section of circuits except the memory cell array 11 (the word line driving circuit 12 and the bit line driving circuit 13, which are hereinafter referred to as a logic circuit). Since the logic circuit uses plural n-channel TFTIs and p-channel TFTs, a cross section of an n-channel TFT and a p-channel TFT is shown as a part of the cross section of the logic circuit.

FIG. 1B shows a top view of the memory cell MC. The cross-sectional view of FIG. 1A corresponds to a cross section along a chain line x-x' of FIG. 1B. FIG. 1C shows an equivalent circuit diagram of the memory cell MC.

A base film 31 is formed covering a surface of the substrate 10. The substrate 10 may be a glass substrate, a quartz substrate, a silicon substrate, a metal substrate, or a stainless steel substrate. The substrate 10 may be different from a substrate used when manufacturing the memory device, and a flexible substrate, a piece of paper made of a fibrous material, or the like can be used. The flexible substrate refers to a substrate which can warp or bend, and for example a plastic substrate made of polycarbonate, polyarylate, polyether sulfone, or the like, or the like can be used. Moreover, a film (including polypropylene, polyester, vinyl, polyvinyl fluoride, vinyl chloride, or the like) can also be used.

The base film 31 may be formed in accordance with the substrate to be used. When a glass substrate, a flexible substrate, or a substrate made of a fibrous material is used, the base film 31 is desirably provided in order to prevent contamination from the substrate. The base film 31 is not necessary when a quartz substrate is used, because a problem of contamination from the substrate is not caused. When a silicon substrate, a metal substrate, or a stainless steel substrate is used, the base film 31 functions as an insulating layer for forming a TFT to have an SOI structure. The base film 31 is formed as a single-layer film or a multilayer film using a material selected from silicon oxide, silicon nitride, silicon nitride oxide ($SiO_xN_y$), diamond-like carbon, aluminum nitride (AlN), and the like. Films of these materials can be formed by a CVD method or a sputtering method.

Semiconductor films 32, 33, and 34 are formed over the base film 31. The semiconductor film 32 is a semiconductor film for a diode of the memory cell MC, in which an impurity region 32p and an impurity region 32n having different conductivity types from each other are formed. In this embodiment mode, the impurity region 32p is a p-type impurity region and the impurity region 32n is an n-type impurity region. The p-type impurity region 32p and the n-type impurity region 32n form pn junction in the semiconductor film 32; therefore, the semiconductor film 32 functions as a pn-junction diode.

The semiconductor films 33 and 34 serve as semiconductor films for the p-channel TFT and the n-channel TFT, respectively. In the semiconductor film 33, two p-type high-concentration impurity regions 33a and 33b and a channel formation region 33c are formed. In the semiconductor film 34, two n-type high-concentration impurity regions 34a and 34b and a channel formation region 34c are formed. The p-type high-concentration impurity regions 33a and 33b and the n-type high-concentration impurity regions 34a and 34b are regions functioning as sources or drains of the transistors.

As described later, the p-type impurity region 32p of the diode and the p-type high-concentration impurity regions 33a and 33b of the p-channel TFT are formed by the same step of adding an impurity imparting p-type conductivity (hereinafter referred to as a p-type impurity). Therefore, the p-type impurity region 32p has the same concentration of the p-type impurity as the p-type high-concentration impurity regions 33a and 33b. On the other hand, the p-type impurity region 32p has higher concentration of an n-type impurity than the p-type high-concentration impurity regions 33a and 33b, and has the same concentration of the n-type impurity as the n-type impurity region 32n. This is because, in the step of adding the n-type impurity to the n-type impurity region 32n, the n-type impurity is also added to the p-type impurity region 32p.

An insulating film 35 is formed covering the semiconductor films 32 to 34. The insulating film 35 functions as a gate insulating film for the TFTs. Therefore, the insulating film 35 is not necessarily formed in a portion corresponding to the memory cell MC. In the logic circuit, first conductive films 37 and 38 are provided over the semiconductor films 33 and 34 with the insulating film 35 interposed therebetween. The first conductive films 37 and 38 function as gate electrodes or gate wires of the TFTs.

A first interlayer insulating film 39 is formed covering the semiconductor films 32 to 34 and the first conductive films 37 and 38. Second conductive films 46 to 51 are formed over the first interlayer insulating film 39. The second conductive film 46 serves as a word line W, which is connected to the p-type impurity region 32p in a contact hole 40 formed in the insulating film 35 and the first interlayer insulating film 39. The second conductive film 47 serves as an electrode for connecting the diode DI to the memory element, and is connected to the n-type impurity region 32n of the semiconductor film 32 in a contact hole 41 formed in the insulating film 35 and the first interlayer insulating film 39. Each of the second conductive films 48 to 51 is in close contact with the high-concentration impurity regions 33a, 33b, 34a, and 34b of the TFTs in contact holes formed in the insulating film 35 and the first interlayer insulating film 39. The second conductive films 48 to 51 serve as wires and electrodes in the logic circuit.

A second interlayer insulating film 53 is formed over the second conductive films 46 to 51. In the memory cell MC, a third conductive film 55 is formed over the second interlayer insulating film 53. The third conductive film 55 forms one conductive film (electrode) of the memory element and is provided separately for each memory cell MC. The third conductive film 55 is in close contact with the second conductive film 47 in a contact hole 54 formed in the second interlayer insulating film 53. The second conductive film 47 serially connects the semiconductor film 32 (diode DI) to the memory element ME.

A third interlayer insulating film 56 is formed over the third conductive film 55. The third interlayer insulating film 56 is also formed in the logic circuit. In the memory cell MC, an opening 57 is formed in the third interlayer insulating film 56 for forming the memory element ME.

An organic compound layer 58 is formed over the third interlayer insulating film 56 in the memory cell MC. The organic compound layer 58 is not separated for each memory cell MC but is formed integrally, i.e., continuously in the memory cell array to constitute one layer.

In the memory cell MC, a fourth conductive film 59 is formed over the organic compound layer 58. The fourth conductive film 59 corresponds to the bit line B. The fourth conductive film 59 is formed integrally, i.e., continuously for each column (in a direction of the bit line) and formed in a stripe or linear shape in the memory cell array. When the third conductive film 55, the organic compound layer 58, and the fourth conductive film 59 are stacked in the opening 57 of the third interlayer insulating film 56, the memory element ME is formed. In the logic circuit, moreover, electrodes and wires can be formed by the fourth conductive film 59.

The diode of the memory cell MC is manufactured over the same insulating surface (over the base film 31 in this embodiment mode) and at the same time as the TFTs for forming the logic circuit. A method for manufacturing the memory device shown in FIGS. 1A to 1C is explained with reference to FIGS. 2A to 10B. In FIGS. 2A to 10B; each of FIGS. 2A, 3A, 4A, 5A, 6A, 7A, 8A, 9A, and 10A shows a cross-sectional view of the memory device, while each of FIGS. 2B, 3B, 4B, 5B, 6B, 7B, 8B, 9B, and 10B shows a top view of the memory cell MC similarly to FIGS. 1A and 1B.

Figure 2B:
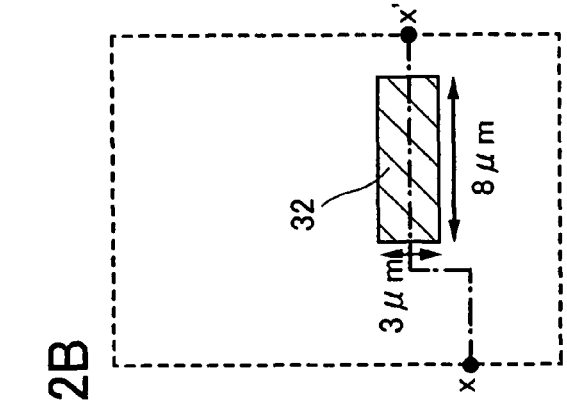
FIG. 2B shows a top-surface structure of a memory cell for explaining a method for manufacturing a memory device (Embodiment Mode 1)

As shown in FIG. 2A, the base film 31 is formed covering a surface of the substrate 10. A crystalline semiconductor film is formed over the base film 31, a resist is formed over the crystalline semiconductor film, and etching is performed to form the semiconductor films 32 to 34 (FIG. 2B). The crystalline semiconductor film is formed over the base film 31 in order to form TFTs with high electric field effect mobility in the logic circuit.

The semiconductor films 32 to 34 are formed of silicon, germanium, or a compound of silicon and germanium (silicon germanium). The crystalline semiconductor film can be obtained by forming and crystallizing an amorphous semiconductor film in such a way that light energy or thermal energy is given to the amorphous semiconductor film.

Amorphous silicon may be formed by a CVD method using a material gas in which a silane ($SiH_4$) gas is diluted with hydrogen. Alternatively, a sputtering method using a target including silicon can be used. In order to form amorphous germanium, a CVD method using a material gas in which a germane ($GeH_4$) gas is diluted with hydrogen may be used. Alternatively, a sputtering method using a target including germanium may be used. In order to form amorphous silicon germanium, a CVD method using a material gas in which a silane ($SiH_4$) gas and a germane ($GeH_4$) gas are mixed with a predetermined ratio and diluted with hydrogen may be employed. Alternatively, a sputtering method using two targets, silicon and germanium, may be used. In a case of forming the amorphous semiconductor film by a CVD method, $SiH_4$, $Si_2H_6$, $SiH_2Cl_2$, $SiHCl_3$, $SiC_4$, $SiF_4$, or the like can be used as a material gas. In addition to a hydrogen gas, a helium gas, a fluorine gas, or a noble gas such as Ar, Kr, or Ne can be added to the material gas.

The crystalline semiconductor film can be formed directly on the base film 31 by a plasma CVD method using the aforementioned material gas.

As a method for crystallizing the amorphous semiconductor film, various methods can be given, such as irradiation with laser light, infrared beam, or the like; heating in an electric furnace; heating after addition of an element for promoting crystallization of a semiconductor; and so on.

As a laser used for the crystallization, either a continuous wave laser (CW laser) or a pulsed laser can be used. For example, a gas laser such as an Ar laser, a Kr laser, or an excimer laser can be given as a laser suitable for the crystallization. Moreover, a solid-state laser suitable for the crystallization is, for example, a laser using a medium of a single crystal or polycrystal (ceramic) of YAG, $YVO_4$, $YAlO_3$, or $GdVO_4$ doped with one or more of Nd, Yb, Cr, Ti, Ho, Er, Tm, and Ta; a laser using a single crystal of forsterite ($Mg_2SiO_4$) as a medium; a glass laser; a ruby laser; an alexandrite laser; a Ti: sapphire laser; or the like. In addition, a copper vapor laser and a gold vapor laser can be used. Not only a fundamental wave of a beam emitted from such a laser but also any of second to fourth harmonics thereof can be used for the irradiation. For example, a second harmonic (532 nm) or a third harmonic (355 nm) of a Nd:$YVO_4$ laser (fundamental wave 1064 nm) can be used. The energy density of the laser beam needs to be in the range of about 0.01 to 100 $MW/cm^2$, preferably in the range of about 0.1 to 10 $MW/cm^2$. The scan speed of the laser beam is set in the range of about 10 to 2000 cm/sec.

A solid-state laser using the aforementioned crystal as a medium, an Ar ion laser, and a Ti: sapphire laser can function as continuous wave lasers. They can also function as pulsed lasers with a repetition rate of 10 MHz or more by performing a Q-switch operation, mode locking, or the like. When a laser beam is emitted with a repetition rate of 10 MHz or more, a semiconductor film is irradiated with a pulsed beam before the semiconductor film melted by the previous laser beam is solidified. Unlike the case of using a pulsed laser with a low repetition rate, the interface between a solid and a liquid formed by laser irradiation can be continuously moved by scanning a laser beam; therefore, a crystal grain grown long along a scanning direction can be obtained.

In addition, the amorphous semiconductor film can also be crystallized by irradiation with infrared light, visible light, or ultraviolet light. In these cases, infrared light, visible light, or ultraviolet light can be used alone or in combination. Typically, light emitted from a halogen lamp, a metal halide lamp, a xenon arc lamp, a carbon arc lamp, a high-pressure sodium lamp, or a high-pressure mercury lamp is used. The lamp light source is lighted for 1 to 60 seconds, preferably 30 to 60 seconds, which is repeated 1 to 10 times, preferably 2 to 6 times. The lamp light source may have arbitrary emission intensity; however, it is set so that the semiconductor film is heated instantaneously at about 600° C. to 1000° C.

The crystallization method using an element for promoting crystallization of the amorphous semiconductor film is preferable for crystallizing the amorphous silicon film. An element for promoting crystallization is introduced in the amorphous silicon film and the film is subjected to laser irradiation or heat treatment at 500° C. to 600° C.; thus, crystalline silicon with a high continuous property of crystal grains at grain boundaries can be obtained. As the element for promoting crystallization of silicon, one or more selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

These elements may be introduced into amorphous silicon by any means without particular limitation as long as the element can exist on the surface of, or inside of the amorphous silicon. For example, a sputtering method, a CVD method, a plasma process method (including a plasma CVD method), an adsorption method, or a method of applying a solution of metal salt can be used. Among these, the method using a solution is simple and it is easy to control the concentration of an element to be introduced into the amorphous silicon. In order to apply the solution, the wettability of the surface of the amorphous silicon is preferably improved so that the solution can spread over the entire surface of the amorphous silicon. In order to improve the wettability, it is desirable to form an ultrathin oxide film with a thickness of 10 nm or less on the surface of the amorphous silicon by irradiation with UV light in an oxygen atmosphere, a thermal oxidation method, treatment using ozone water including hydroxy radicals or hydrogen peroxide, or the like.

The element used for the crystallization is desirably removed from the silicon film after the crystallization because the introduced element deteriorates the characteristics of the transistor and the diode. The method is hereinafter explained.

First, a surface of the crystalline silicon film is subjected to treatment using a water solution including ozone (typically, ozone water), so that a barrier layer including an oxide film (called chemical oxide) is formed in 1 to 10 nm thick on the surface of the crystalline semiconductor film. The barrier layer functions as an etching stopper in a later step of removing only a gettering layer.

Subsequently, the gettering layer including a noble gas element is formed as a gettering site over the barrier layer. Here, a semiconductor film including a noble gas element is formed as the gettering layer by a CVD method or a sputtering method. When the gettering layer is formed, a sputtering condition is appropriately adjusted so that the noble gas element is added to the gettering layer. As the noble gas element, one or more selected from helium (He), neon (Ne), argon (Ar), krypton (Kr), and xenon (Xe) can be used. When the gettering layer is formed using a material gas including phosphorus as an impurity element or using a target including phosphorus as an impurity element, gettering can be performed by using Coulomb's force of phosphorus in addition to the gettering by the noble gas element. Since a metal element (such as nickel) tends to move to a region with high oxygen concentration during the gettering, the oxygen concentration of the gettering layer is desirably, for example, $5\times10^{18}$ atoms/cm$^2$ or more.

Subsequently, the introduced element (such as nickel) is gettered by performing thermal treatment on the crystalline silicon film, the barrier layer, and the gettering layer (such as heat treatment or treatment of irradiating with intense light) to remove the element from the crystalline silicon film, thereby decreasing the concentration of the element.

After forming the crystalline semiconductor film, the crystalline semiconductor film is processed into a predetermined shape to form the semiconductor film 32 for the diode and the semiconductor films 33 and 34 for the TFTs. Next, as shown in FIG. 2A, the insulating film 35 is formed on the surface of the substrate 10. The insulating film 35 serves as the gate insulating film for the TFTs. The insulating film 35 may be formed as a single-layer film or a multilayer film using silicon oxide or silicon nitride oxide (SiO$_x$N$_y$) with a thickness of 10 nm to 60 nm. Such an insulating film can be formed by a CVD method or a sputtering method.

A conductive film is formed over the insulating film 35. A mask is formed of resist over the formed conductive film by a photolithography method. The conductive film is etched by using a mask, thereby forming the first conductive films 37 and 38 functioning as gate electrodes and gate wires for the TFTs (see FIG. 3A). Prior to the formation of the first conductive films 37 and 38, a step of adding one or both of the n-type impurity and the p-type impurity to the semiconductor films 33 and 34 is performed as necessary in order to control the threshold voltage of the TFTs.

Each of the first conductive films 37 and 38 may be either a single-layer conductive film or a multilayer conductive film. The first conductive films 37 and 38 can be formed by using a film including a metal selected from tantalum (Ta), tungsten (W), titanium (Ti), molybdenum (Mo), aluminum (Al), copper (Cu), and chromium (Cr); an alloy containing the element as its main component (such as an alloy of Al and Ti); or a nitride of the element. For example, a multilayer film including tantalum nitride (TaN) as a first layer and tungsten (W) as a second layer can be used for forming the first conductive films 37 and 38. These conductive films can be formed by a sputtering method, an evaporation method, a CVD method, or the like.

Next, a resist R1 is formed to cover the semiconductor films 33 and 34 of the TFTs as shown in FIG. 3A in order to add the n-type impurity only to the semiconductor film 32 of the diode. An impurity imparting n-type conductivity (hereinafter referred to as n-type impurity) is added to the entire semiconductor film 32 to form the n-type impurity region of the diode. As the n-type impurity, phosphorus (P) or arsenic (As) can be used. An ion doping method, an ion implantation method, or the like can be used as an addition method. By this step, the entire semiconductor film 32 becomes an n-type impurity region 61 (see FIGS. 3A and 3B). In accordance with this step, the concentration of the n-type impurity of the n-type impurity region 32n to be finally formed in the semiconductor film 32 is determined. The concentration of the n-type impurity in the n-type impurity region 61 may be in the range of about $1\times10^{18}$ atoms/cm$^3$ to $5\times10^{21}$ atoms/cm$^3$. Alternatively, the n-type impurity region 61 can be formed prior to the formation of the first conductive films 37 and 38.

Next, p-type impurity regions are formed in the semiconductor films 32 and 33. As shown in FIGS. 4A and 4B, a resist R2 partially covering the semiconductor film 32 and a resist R3 covering the entire semiconductor film 34 are formed by a photolithography method. The resist R2 covers a portion to become the n-type impurity region 32n. The p-type impurity is added to the semiconductor films 32 and 33. Boron (B) is used as the p-type impurity. The p-type impurity can be added by an ion doping method, an ion implantation method, or the like similarly to the n-type impurity.

By the addition of the p-type impurity, the first conductive film 37 functions as a mask so that the p-type high-concentration impurity regions 33a and 33b are formed in a self-aligning manner in the semiconductor film 33 of the p-channel TFT. At the same time, a region to which the p-type impurity is not added is determined as the channel formation region 33c in a self-aligning manner. The p-type impurity is added selectively to a region determined by the resist R2 in the semiconductor film 32 of the memory cell MC, thereby forming the p-type impurity region 32p. The region covered with the resist R2 becomes the n-type impurity region 32n (see FIGS. 4A and 4B).

The concentration of the p-type impurity of the p-type impurity region 32p may be set in the range of $1\times10^{18}$ atoms/cm$^3$ to $5\times10^{21}$ atoms/cm$^3$. Since the semiconductor film 32 has already become the n-type impurity region 61, the p-type impurity is added more than the n-type impurity added in advance so that the p-type impurity region 32p has p-type conductivity. Therefore, the concentration of the p-type impurity of the p-type impurity region 32p is 1.3 times or more, preferably 2 times or more, higher than that of the n-type impurity of the n-type impurity region 61 (n-type impurity region 32n).

In this embodiment mode, since the p-type impurity regions in the memory cell MC and in the logic circuit are formed by the same step of adding the impurity, the concentration and concentration gradient of the p-type impurity are similar in the p-type impurity regions of the memory cell and the logic circuit. On the other hand, the p-type impurity region 32p of the memory cell MC and the p-type high-concentration impurity regions 33a and 33b of the logic circuit are different in the concentration of the n-type impurity. The concentration of the n-type impurity of the former is higher than that of the latter.

As shown in this embodiment mode, when an impurity is added in advance to the entire semiconductor film 32 of the diode so that the semiconductor film 32 has one conductivity type and an impurity imparting the opposite conductivity type is added selectively, pn junction can be more surely formed in the semiconductor film 32.

After removing the resists R2 and R3, resists R4 and R5 are newly formed by a photolithography method to cover the entire semiconductor films 32 and 33 as shown in FIGS. 5A and 5B. Then, the n-type impurity is added to the semiconductor film 34. The n-type high-concentration impurity regions 34a and 34b are formed in a self-aligning manner in the semiconductor film 34 using the first conductive film 38 as a mask. At the same time, a region to which the n-type impurity is not added is formed as the channel formation region 34c in a self-aligning manner. The n-type high-concentration impurity regions 34a and 34b function as source or drain regions of the TFT.

After removing the resists R4 and R5, the semiconductor films 32 to 34 are subjected to heat treatment or laser irradiation to activate the n-type impurity and the p-type impurity added to the semiconductor films 32 to 34.

In the present invention, in order to form pn junction in the semiconductor film of the memory cell in a sequence of steps of forming the impurity regions in the semiconductor film of the logic circuit, the p-type impurity region 32p and the n-type impurity region 32n are arranged in one semiconductor film over the same insulating surface, instead of having a two-layer structure in which a p-type semiconductor film and an n-type semiconductor film are stacked. As a result, the pn-junction surface of the memory cell MC (semiconductor film 32) is formed in parallel with a surface where the channel formation region and the impurity region of the thin film transistor are bonded with each other.

Figures 6A, 6B:
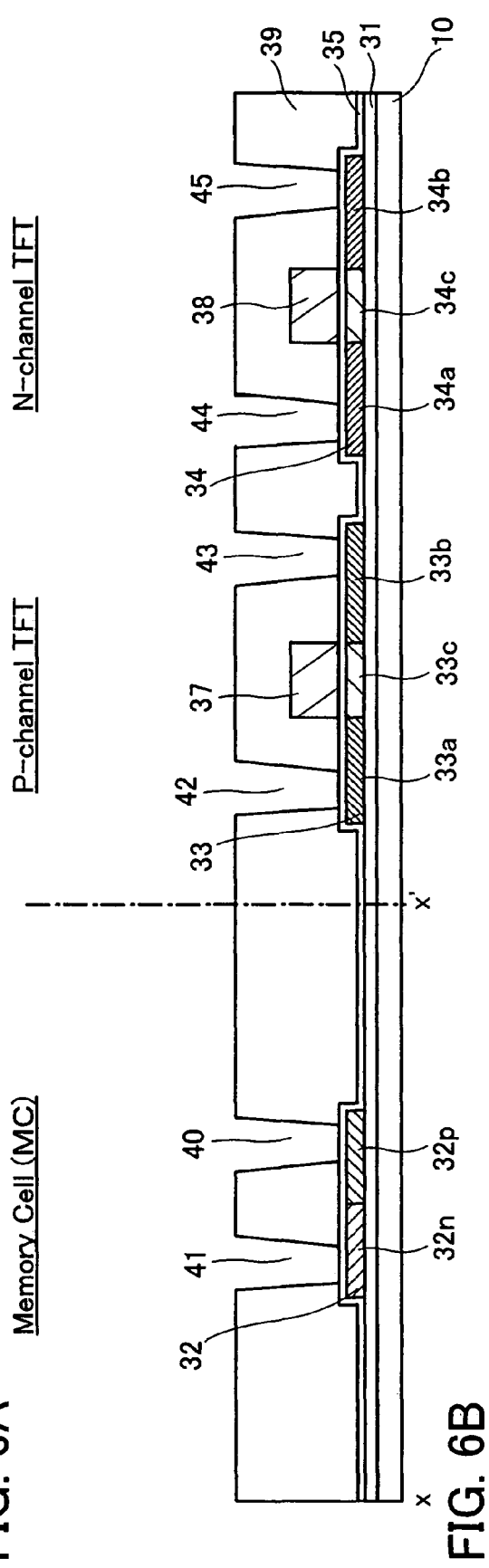
FIG. 6A shows a cross-sectional structure of a part of a memory device for explaining a method for manufacturing a memory device.
FIG. 6B shows a top-surface structure of a memory cell for explaining a method for manufacturing a memory device (Embodiment Mode 1)

The first interlayer insulating film 39 is formed over the entire surface of the substrate 10 (see FIGS. 6A and 6B). As the first interlayer insulating film 39, an inorganic insulating film such as a film of silicon oxide, silicon nitride, or silicon oxynitride ($SiO_xN_y$) can be used. Moreover, an organic resin film such as a film of a polyimide resin or an acrylic resin, or a film including siloxane may be used. The organic resin may be either photosensitive or nonphotosensitive. It is to be noted that siloxane is a material of which skeletal structure includes a bond of silicon (Si) and oxygen (O), and an organic group (such as an alkyl group or an aryl group) is used for the substituent. A fluoro group may be included in the substituent. The first interlayer insulating film 39 can be formed of any of these insulating materials in a single-layer or multi-layer structure. For example, an inorganic insulating film including silicon nitride may be formed as a first layer and an organic resin film including a polyimide resin or the like may be formed as a second layer.

A resist is formed by a photolithography method, and the first interlayer insulating film 39 and the insulating film 35 are etched by using the resist. Thus, contact holes 40 to 45 reaching the impurity regions 32p, 32n, 33a, 33b, 34a, and 34b are formed as shown in FIG. 6A.

A conductive film is formed over the first interlayer insulating film 39. This conductive film is processed into a predetermined shape by a photolithography method and an etching method, thereby forming the second conductive films 46 to 51 as shown in FIGS. 7A and 7B. The second conductive films 46 to 51 can be formed of similar materials to those of the first conductive films 37 and 38. In the memory cell MC, the second conductive film 46 serves as a word line W. The second conductive film 46 is formed integrally for the plural memory cells MC in the same row and constitutes one word line W. On the other hand, the second conductive film 47 is formed separately for each memory cell MC.

Figures 8A, 8B:
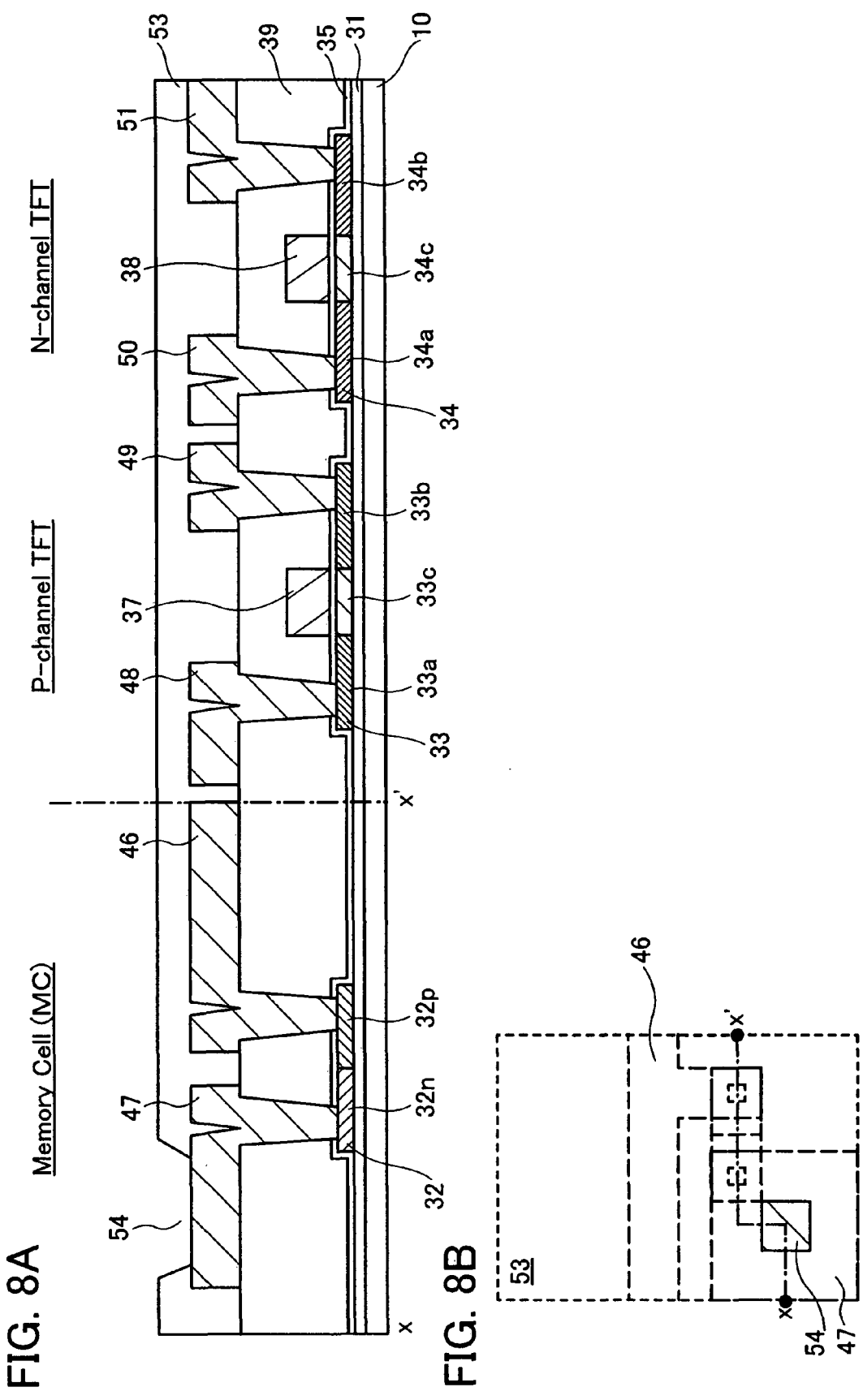
FIG. 8A shows a cross-sectional structure of a part of a memory device for explaining a method for manufacturing a memory device.
FIG. 8B shows a top-surface structure of a memory cell for explaining a method for manufacturing a memory device (Embodiment Mode 1)

As shown in FIGS. 8A and 8B, the second interlayer insulating film 53 is formed over the entire surface of the substrate 10. In the second interlayer insulating film 53, the contact hole 54 reaching the second conductive film 47 is formed for each memory cell MC. The second interlayer insulating film 53 can be formed as a single-layer or a multilayer using a similar insulating film to the first interlayer insulating film 39. In a case of using a photosensitive resin for the second interlayer insulating film 53, an uncured resin is applied, light-exposure is carried out using a predetermined mask, and development and baking are conducted; thus, a resin film having the contact hole 54 can be formed. In a case of forming a nonphotosensitive resin or forming an insulating film by a CVD method, a sputtering method, or the like, the contact hole 54 may be formed by a photolithography method and an etching method after forming the insulating film.

Subsequently, a conductive film is formed over the second interlayer insulating film 53 by a sputtering method or an evaporation method and processed into a predetermined shape by a photolithography method and an etching method, thereby forming the third conductive film 55 as shown in FIGS. 9A and 9B. The third conductive film 55 is divided for each memory cell MC. The third conductive film 55 can be formed by similar material and method to those of the first and second conductive films. Moreover, in the logic circuit, electrodes, wires, and the like can also be formed by the third conductive film.

As shown in FIG. 10A, the third interlayer insulating film 56 is formed over the entire surface of the substrate 10. In the third interlayer insulating film 56, the opening 57 reaching the third conductive film 55 is formed for each memory cell MC as shown in FIGS. 10A and 10B. The third interlayer insulating film 56 and the opening 57 are formed similarly to the second interlayer insulating film 53 and the contact hole 54, respectively. By providing the third interlayer insulating film 56, an effect of an electric field by the adjacent memory cells MC can be prevented. Moreover, when the third interlayer insulating film 56 is provided so as to cover the step due to a connection portion (contact hole 54) of the second conductive film 47 and the third conductive film 55 which becomes one electrode of the memory element, disconnection of the organic compound layer 58 to be formed later can be prevented. In order to improve the step coverage of the organic compound layer 58, a side surface of the third interlayer insulating film 56 having the opening 57 preferably has a tilt angle of 10° or more and less than 60°, preferably 25° to 45°, with respect to a surface of the third conductive film 55. It is more preferable that the side surface of the third interlayer insulating film 56 be curved.

As shown in FIG. 1A, the organic compound layer 58 is formed over the third interlayer insulating film 56 and the exposed potion of the third conductive film 55 in the memory cell MC. Since the portion of the organic compound layer 58 that functions as the memory element ME is determined by the opening 57, the organic compound layer 58 is not necessarily divided for each cell. In this embodiment mode, the organic compound layer 58 is formed integrally in the memory cell array and formed as one film. The organic compound layer 58 can also be formed separately for each column and each row.

The organic compound layer 58 can be formed by a droplet discharging method, a spin coating method, an evaporation method, or the like. Depending on a condition of an organic material and the like to be used, either of the following methods can be used: a method in which the organic compound layer is formed in a desired shape, and a method in which the organic compound layer is formed and then processed into a desired shape. When the organic compound layer to be used is sensitive to heat or a chemical action, the organic compound layer is desirably processed into a desired shape at the formation. As examples of such a method, there are a method in which the organic compound layer is formed in a desired shape by using a metal mask, and a method in which the organic compound layer is drawn to be a desired shape without using a metal mask by a droplet discharging method.

The metal mask is a metal plate having a hole of a desired shape. When the metal plate is provided between a substrate and a material at the evaporation of an organic compound, a film having the shape of the hole can be manufactured. The droplet discharging method is a collective term for a pattern forming method by discharging droplets, such as an ink jet method or a dispenser method, which has an advantage of not wasting a material.

When the organic compound has relatively high resistance to heat and a chemical action, the organic compound can be processed into a desired shape after the formation. For example, a method is given in which the organic compound is formed by an evaporation method, a spin coating method, or the like and then processed into a desired shape by a photo-lithography method. The spin coating method is effective because film formation can be carried out very easily.

As shown in FIGS. 1A and 1B, the fourth conductive film 59 to become the bit line B is formed after forming the organic compound layer 58. The fourth conductive film 59 can be formed by a similar material to the materials of the first and second conductive films. The fourth conductive film 59 is preferably formed by a method that does not damage the organic compound layer 58 below, and particularly an evaporation method is preferable. By the use of the metal mask, the fourth conductive film 59 processed into a predetermined shape can be formed directly on the organic compound layer 58 by an evaporation method. The fourth conductive film 59 constitutes one bit line B, and is formed integrally for each column of the memory cell array. That is to say, the fourth conductive film 59 has a stripe shape or a linear shape.

Thus, the memory device using the organic compound can be manufactured. When a diode is provided as a switching element in the memory cell MC, data can be written in the memory cell array at a time other than during manufacturing.

When the semiconductor film for the diode of the memory cell MC and the semiconductor film (active layer) for the TFT are manufactured at the same time and in the same layer, the memory cell array and the circuit (logic circuit) for controlling the memory cell array can be manufactured over the same substrate and at the same time. Moreover, manufacturing of the diode does not need special modification or addition to the manufacturing steps of the TFT, and moreover does not need special material and step. Accordingly, the memory device of the present invention can be manufactured by using conventional manufacturing facilities and manufacturing materials of thin film transistors; thus, new capital investment is not necessary.

In this embodiment mode, the p-type impurity region 32$p$ of the semiconductor film 32 is connected to the word line; however, the n-type impurity region 32$n$ can be connected thereto. Moreover, although the n-type impurity is added first to the semiconductor film 32, the p-type impurity may be added instead. In the latter case, the n-type impurity may be added to the semiconductor film 32 when adding the n-type impurity to the semiconductor film 34 (step of FIG. 4A).

In this embodiment mode, the n-type impurity region 32$n$ and the n-type high-concentration impurity regions 34$a$ and 34$b$ of the n-channel TFT are manufactured by different steps of adding the impurity; however, similarly to the p-type impurity region 32$p$, they can be manufactured by the same adding step.

In this case, the step of forming the n-type impurity region 61 shown in FIG. 3A is omitted. Then, in the step shown in FIG. 5A, the n-type impurity is added to the semiconductor films 32 and 34 without forming the resist R4 so that the entire semiconductor film 32 becomes the n-type impurity region. Thus, the n-type high-concentration impurity regions 33$a$ and 33$b$ are formed in the semiconductor film 34. Then, as shown in FIG. 4A, the resists R2 and R3 are formed and the p-type impurity is added to the semiconductor films 32 and 33, thereby forming the p-type impurity region 32$p$ and the p-type high-concentration impurity regions 33$a$ and 33$b$.

Embodiment Mode 2

FIGS. 14A to 14C show a part of a memory device of this embodiment mode. A method of illustration of FIGS. 14A to 14C is similar to that of FIGS. 1A to 1C. That is, FIG. 14A shows a partial cross-sectional view of the memory device, FIG. 14B shows a top view of a memory cell MC, and FIG. 14C shows an equivalent circuit diagram of the memory cell MC. In this embodiment mode, the second conductive films 46 and 47 shown in Embodiment Mode 1 are changed into a first conductive film 76 and a second conductive film 77. The other points are similar to Embodiment Mode 1.

As shown in FIGS. 14A to 14C, in this embodiment mode, the word line W is formed by the first conductive film 76 provided in the same layer as the first conductive films 37 and 38. Moreover, the word line W (first conductive film 76) is connected to the n-type impurity region 32$n$ and the second conductive film 77 is connected to the p-type impurity region 32$p$.

A method for manufacturing the memory device of this embodiment mode is explained with reference to FIGS. 14A to 21B. Similarly to Embodiment Mode 1, the memory cell array and the logic circuit are manufactured over the substrate 10 at the same time. Similarly to FIGS. 14A and 14B, each of FIGS. 15A, 16A, 17A, 18A, 19A, 20A, and 21A shows a part of cross section of the memory device, while each of FIGS. 15B, 16B, 17B, 18B, 19B, 20B, and 21B shows a top view of the memory cell MC.

First, the base film 31 is formed over the substrate 10 as shown in FIG. 2A by a similar step to that in Embodiment Mode 1. The semiconductor film 32 of the diode, the semiconductor film 33 of the p-channel TFT, and the semiconductor film 34 of the n-channel TFT are formed over the base film 31.

Figures 15A, 15B:
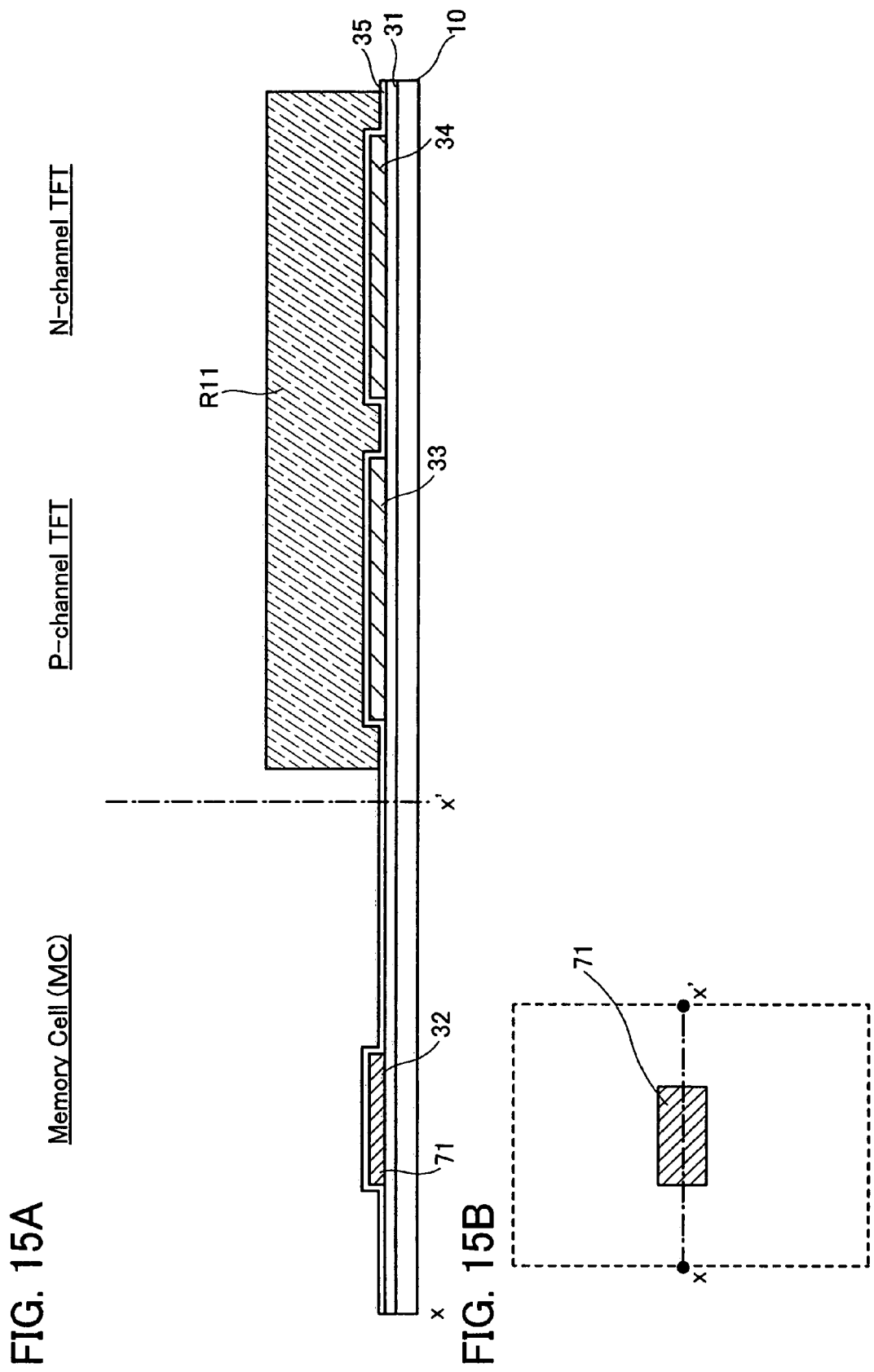
FIG. 15A shows a cross-sectional structure of a part of a memory device for explaining a method for manufacturing a memory device.
FIG. 15B shows a top-surface structure of a memory cell for explaining a method for manufacturing a memory device (Embodiment Mode 2)

As shown in FIGS. 15A and 15B, the n-type impurity is added to the entire semiconductor film 32 prior to the formation of the first conductive film. As shown in FIGS. 15A and 15B, a resist R11 covering the semiconductor films 33 and 34 is formed and the n-type impurity is added to the semiconductor film 32, thereby forming an n-type impurity region 71.

The resist R11 is removed, and the first conductive films 76, 37, and 38 are formed over the insulating film 35 as shown in FIGS. 16A and 16B. The first conductive film 76 has such a shape that covers a portion to become the n-type impurity region 32$n$ so as to function as a mask in a later-described step of adding a p-type impurity. Moreover, the first conductive film 76 constitutes one word line, and is formed for each column of the memory cell array.

Next, a resist R12 is formed covering the semiconductor film 34 and the p-type impurity is added to the semiconductor films 32 and 33. In the semiconductor film 32, the p-type impurity region 32$p$ is formed in a self-aligning manner by using the first conductive film 76 as a mask, and at the same time, the n-type impurity region 32$n$ is determined. Moreover, the first conductive film 37 functions as a mask so that the p-type high-concentration impurity regions 33$a$ and 33$b$ and the channel formation region 33$c$ are formed in a self-aligning manner in the semiconductor film 33.

The resist R12 is then removed. As shown in FIGS. 17A and 17B, a resist R13 covering the semiconductor film 32 and a resist R14 covering the semiconductor film 33 are formed. The n-type impurity is added to the semiconductor film 34. The first conductive film 38 functions as a mask so that the n-type high-concentration impurity regions 34$a$ and 34$b$ and the channel formation region 34$c$ are formed in a self-aligning manner in the semiconductor film 34.

As shown in FIGS. 18A and 18B, the first interlayer insulating film 39 is formed. After forming contact holes in the first interlayer insulating film 39, the second conductive films 77 and 48 to 51 are formed. The second conductive film 77 is formed for each memory cell MC.

Figure 20A:
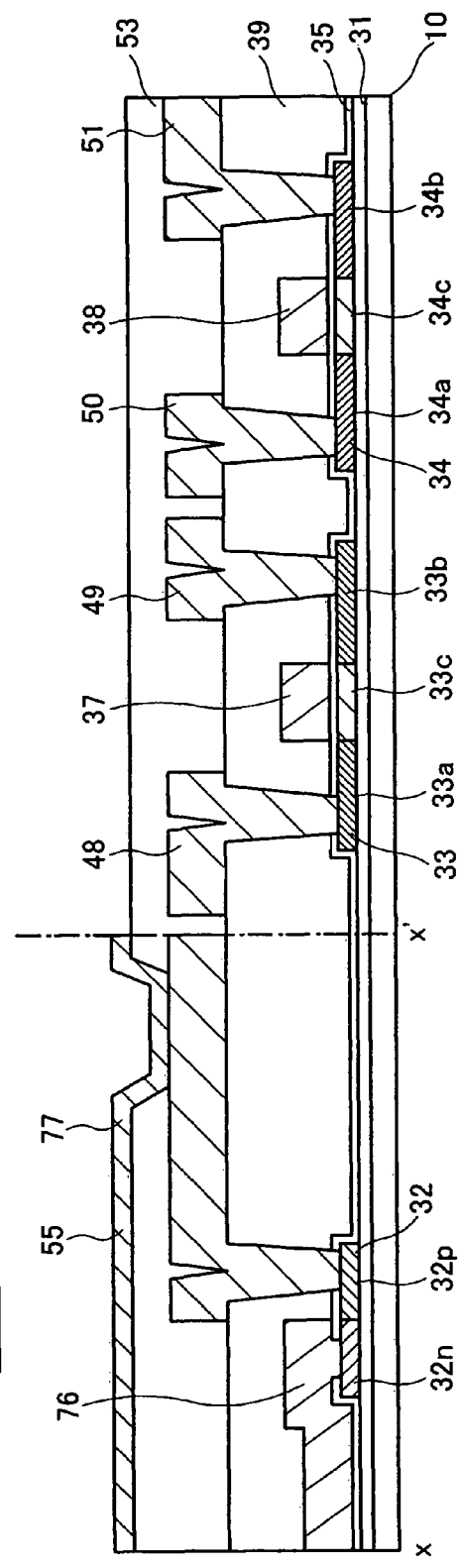
FIG. 20A shows a cross-sectional structure of a part of a memory device for explaining a method for manufacturing a memory device.
Figure 20B:
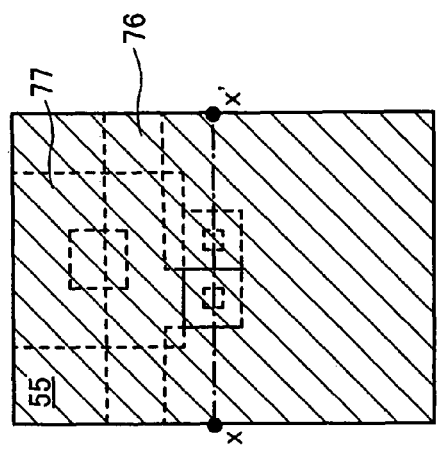
FIG. 20B shows a top-surface structure of a memory cell for explaining a method for manufacturing a memory device (Embodiment Mode 2)
Figure 21A:
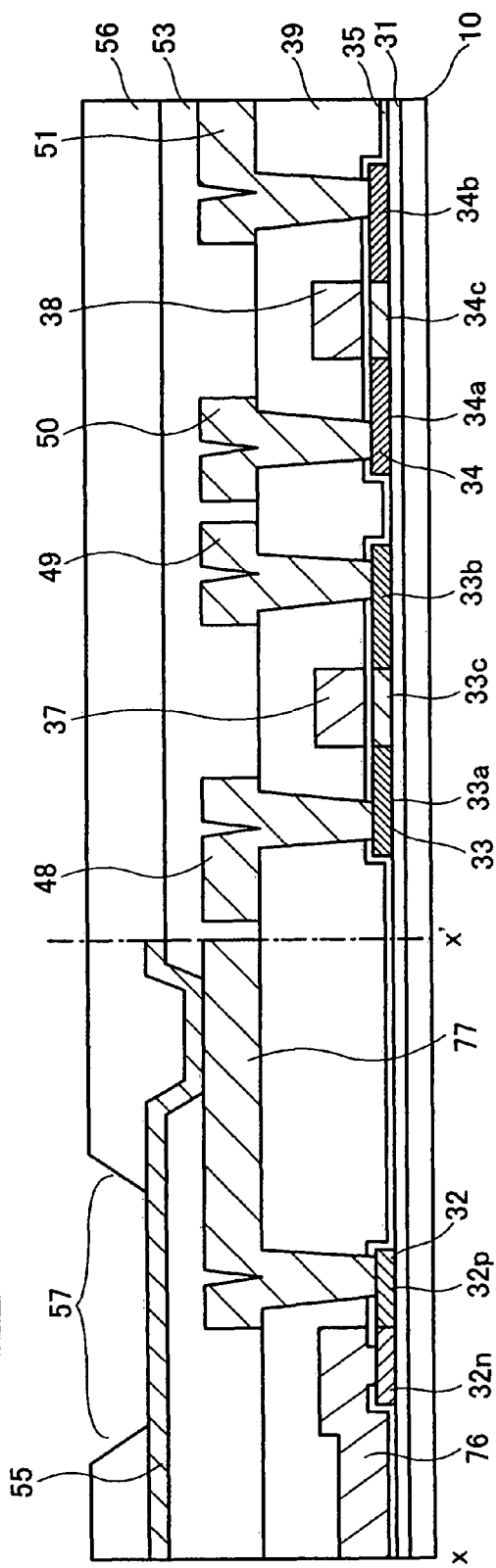
FIG. 21A shows a cross-sectional structure of a part of a memory device for explaining a method for manufacturing a memory device.
Figure 21B:
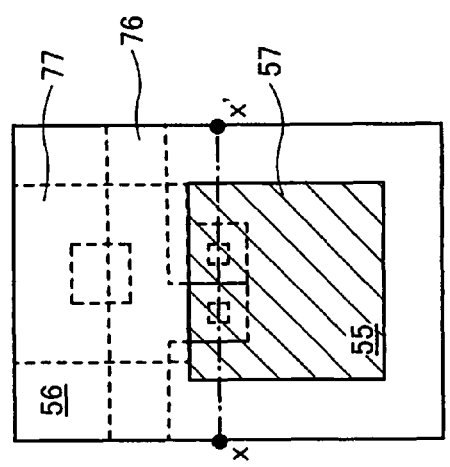
FIG. 21B shows a top-surface structure of a memory cell for explaining a method for manufacturing a memory device (Embodiment Mode 2)

As shown in FIGS. 19A and 19B, the second interlayer insulating film 53 having the contact hole 54 reaching the first conductive film 77 is formed. The third conductive film 55 is formed as shown in FIGS. 20A and 20B. The third conductive film 55 is formed for each memory cell MC. The third interlayer insulating film 56 having the opening 57 is formed as shown in FIGS. 21A and 21B. The organic compound layer 58 and the fourth conductive film 59 which becomes a bit line are formed as shown in FIGS. 14A and 14B. As above, the memory cell array and the logic circuit are manufactured over the substrate 10.

Embodiment Mode 3

This embodiment mode will explain a method of writing data in, and reading data from the memory devices shown in Embodiment Modes 1 and 2.

An operation for writing data is explained with reference to FIGS. 11 and 12. The data writing is carried out by applying an electric action to the organic compound layer of the memory element ME. In this embodiment mode, explanation is made on an example of carrying out data writing by utilizing the decrease in a resistance value when a voltage is applied to the organic compound layer. It is assumed that data is "0" in an initial state of the memory cell (state in which the organic compound layer has a high resistance value), and data is "1" in a state that the organic compound layer has a low resistance value.

It is assumed that the data "1" is written in the memory cell MC positioned at (Wh, Bk). The memory cell MC is selected by the word line driving circuit 12 and the bit line driving circuit 13. A predetermined voltage of V2 is applied to the word line Wh connected to the memory cell MC by the word line driving circuit 12. In addition, the bit line Bk connected to the memory cell MC is selected by the bit line driving circuit 13, and the selected bit line Bk is connected to a writing circuit. Then, a writing voltage of V1 is outputted from the writing circuit to the selected bit line Bk. Thus, a voltage $V_w = V_1 - V_2$ is applied between the pair of conductive films in the memory element ME. By appropriately selecting the voltage $V_w$, the organic compound layer provided between the pair of conductive films changes physically or electrically to decrease the resistance value. Thus, the data "1" is written.

The voltages $V_1$, $V_2$, and $V_w$ are determined so that the electric resistance between the first conductive film and the second conductive film in the state of having the data "1" is drastically lower than that in the initial state (state of having the data "0"). For example, $V_1 = 0$ V and $5 V \leq V_2 \leq 15 V$. When the diode is directed oppositely from the diode shown in FIG. 12, $3 V \leq V_1 \leq 5 V$ and $-12 V \leq V_2 \leq -2 V$. The voltage $V_w$ may be set in the range of $5 V \leq V_w \leq 15 V$ or $-5 V \leq V_w \leq -15 V$ in accordance with the direction of the diode.

When a predetermined voltage of, for example, $(V_1 + V_2)/2$ is applied to the non-selected word line and the non-selected bit line, it is possible to control so that the data "1" is not written in the non-selected memory cell MC. In other words, data can be written in the memory cell MC at a time other than during manufacturing. Since the diode is serially connected to the memory element ME, the selectivity of the memory element ME in which the data is written is excellent.

When the data "0" is written in the memory cell MC, an electric action is not necessary to be applied to the memory cell MC. To operate the circuit, for example, predetermined word line Wh and bit line Bk are selected by the word line driving circuit 12 and the bit line driving circuit 13, similarly to the case of writing "1". In the bit line driving circuit 13, the output potential from the writing circuit to the bit line Bk is made similar to that of the selected word line Wh or that of the non-selected word line, and a voltage of such a degree that does not change the resistance value of the memory element ME (for example, a voltage of −5 V to 5 V) is applied between the first conductive film and the second conductive film that constitute a part of the memory element ME. In the case of reading data from the memory cell MC, a row is selected by the word line driving circuit 12. On the other hand, a column is selected by a selector in the bit line driving circuit 13, and the bit line in the selected column is connected to the reading circuit. Since the diode is serially connected to the memory element ME, it is possible to select an arbitrary memory element ME and read data from the selected memory element ME. Then, a value of current flowing through the memory cell MC is detected based on a value of current flowing through the bit line in the selected column, whereby whether the data written in the memory cell MC is "0" or "1" can be judged.

Embodiment Mode 4

By providing the diode in the memory cell MC as shown in Embodiment Modes 1 and 2, high integration can be achieved. This embodiment mode will explain achievement of high integration of memory devices by the present invention, based on the comparison between the size of a memory cell provided with a TFT and the size of a memory cell provided with a diode of the present invention.

Figure 22A:
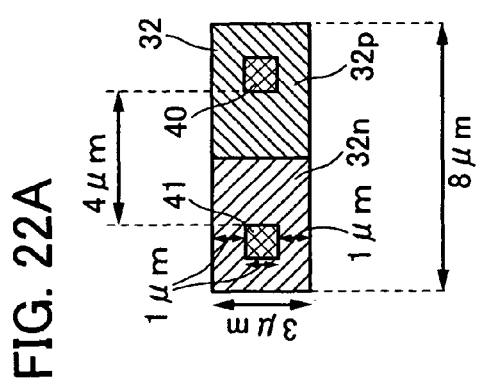
FIGS. 22A to 22C show design examples of a memory cell of the present invention (Embodiment Mode 4)

A design example of the memory cell is explained with reference to FIGS. 22A to 23. Values shown in FIGS. 22A to 23 are designed in consideration of the margin of a manufacturing apparatus. The alignment margin of the substrate is 1 μm, and the margin of a light-exposure apparatus is 3 μm. As the light-exposure apparatus, a mirror projection mask aligner (abbr.: MPA), which is generally used for the manufacturing of a liquid crystal display device, is used here.

FIG. 22A corresponds to FIG. 6B. As shown in FIG. 22A, the semiconductor film 32 has a rectangular shape with a size of 3 μm×8 μm. The contact holes 41 and 40 each have a size of 1 μm×1 μm (at the bottom surface) and they have a distance of 4 μm in between. The distance between the end of the semiconductor film 32 and each of the contact holes 40 and 41 is 1 μm.

Figure 22B:
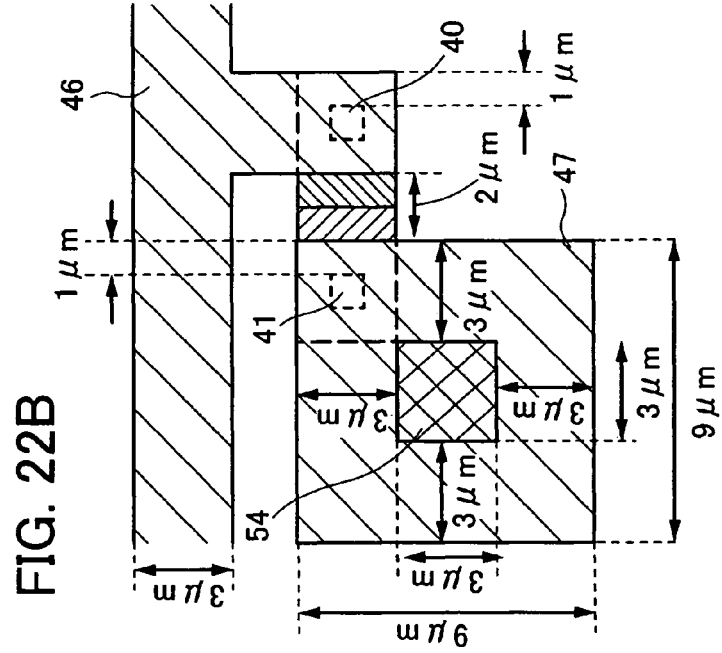
Figure 23:
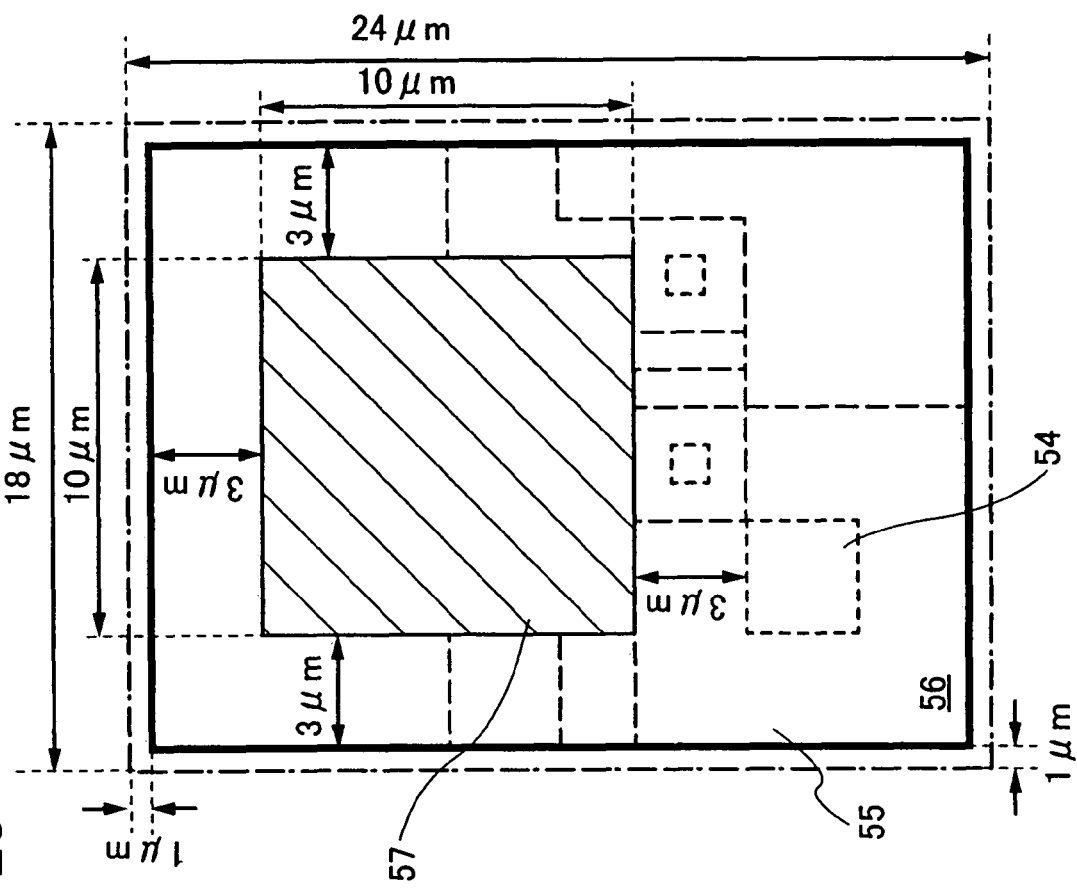
FIG. 23 shows a design example of a memory cell of the present invention (Embodiment Mode 4)

FIG. 22B corresponds to FIG. 8B. As shown in FIG. 22B, the second conductive film 46 constituting the word line has a width of 3 μm. The final size of the memory cell depends on the size of the third conductive film 55; therefore, the width of the second conductive film 46 does not affect the size of the memory cell. Accordingly, the width of the second conductive film 46 can be larger than 3 μm in consideration of the resistance value and the like. The distance between the end of the second conductive film 46 and the contact hole 40 is 1 μm.

The second conductive film 47 has a size of 9 μm×9 μm. The contact hole 54 has a size of 3 μm×3 μm, the distance between the end of the second conductive film 47 and the contact hole 54 is 3 μm, and the distance between the end of the second conductive film 47 and the contact hole 41 is 1 μm. The distance between the second conductive film 46 and the second conductive film 47 is 2 μm.

Figure 22C:
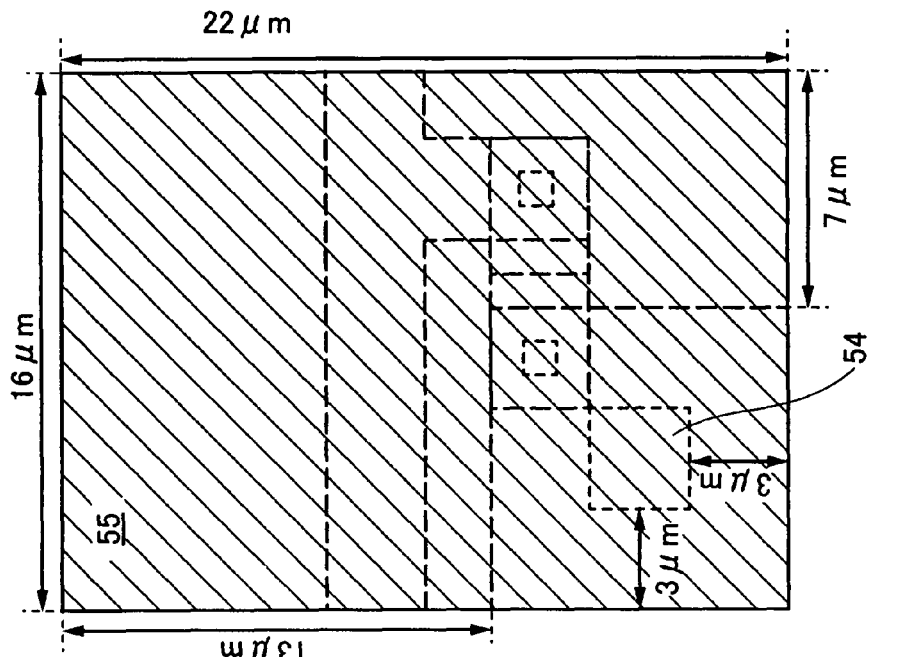

FIG. 22C corresponds to the top view of FIG. 9B. As shown in FIG. 22C, the third conductive film 55 constituting one electrode of the memory element has a size of 16 µm×22 µm. The distance between the end of the third conductive film 55 and the contact hole 54 is 3 µm. Moreover, the memory cell MC has a size of 18 µm×24 µm including a margin of 1 µm from the end of the third conductive film 55.

FIG. 23 corresponds to the top view of FIG. 1B. The opening 57 determining the size of the memory element has a size of 10 µm×10 µm. The distance between the end of the third conductive film 55 and the opening 57 is 3 µm. The distance between the contact hole 54 and the opening 57 is 3 µm.

Although this embodiment mode explains the memory cell of Embodiment Mode 1 as the memory cell of the present invention, the memory cell of Embodiment Mode 2 also has a size of 16 µm×22 µm.

Figure 24B:
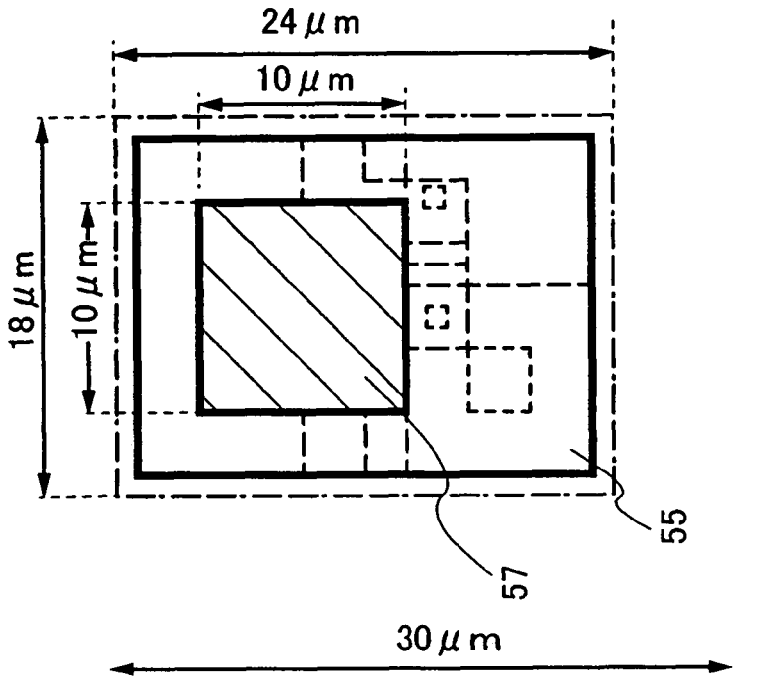
Figure 24A:
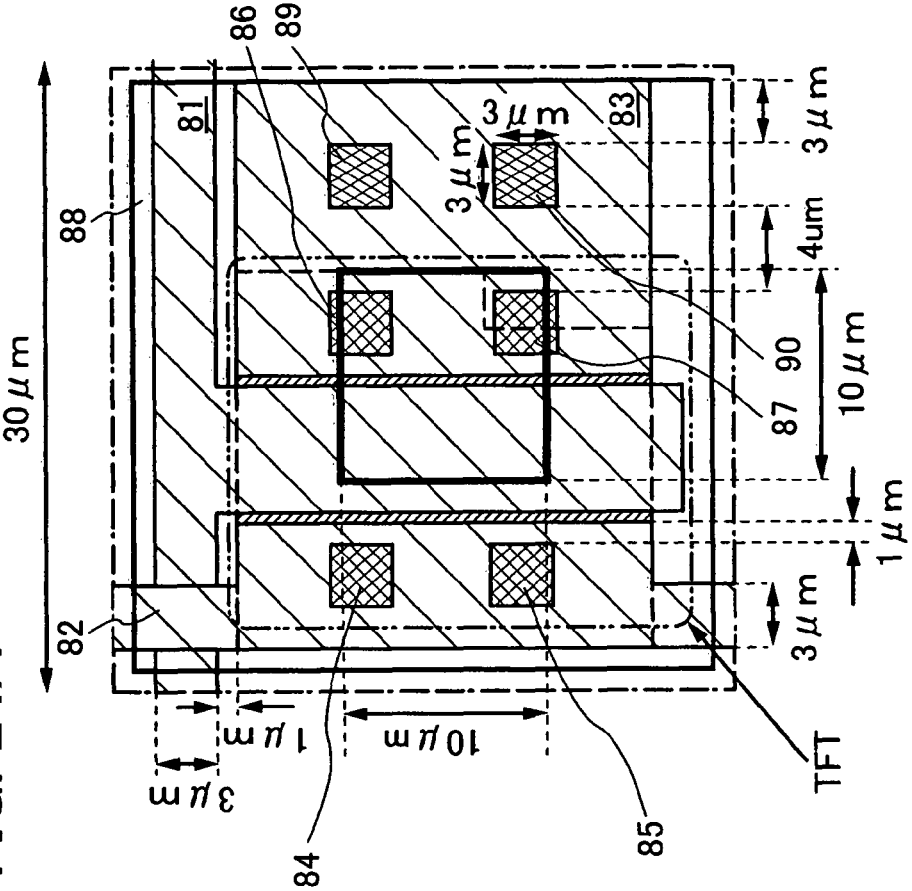
FIG. 24A shows a design example of a memory cell size in a comparative example.

FIG. 24A is a top view of a memory cell of a comparative example. In the comparative example, a TFT is provided instead of a diode in the memory cell. The TFT has the same cross-sectional structure as that in the TFT shown in FIGS. 1A to 1C. Similarly to the case of the diode, design is conducted assuming that the alignment margin of the substrate is 1 µm and the margin of the light-exposure apparatus is 3 µm.

The TFT has a channel length (gate length) of L=6 µm and a channel width of W=20 µm. A first conductive film 81 to serve as a gate wire has a width of 3 µm. A second conductive film 82 to serve as a word line also has a width of 3 µm. The second conductive film 83 also serves as an electrode for connecting a memory element to the TFT. The distance between the first conductive film 81 and the second conductive films 82 and 83 is 1 µm. Contact holes 84 to 87 provided in the first interlayer insulating film 39 and the insulating film 35 for connecting the second conductive films 82 and 83 to the TFT each have a size of 3 µm×3 µm.

A third conductive film 88 to serve as one electrode of the memory element has a size of 30 µm×30 µm. The size of the memory cell depends on the size of the third conductive film 88. The contact holes 89 and 90 formed in the second interlayer insulating film 53 for connecting the third conductive film 88 and the second conductive film 93 each have a size of 3 µm. The distance between the contact holes 84 and 85 and the distance between the contact holes 86, 87, 89, and 90 are each 4 µm.

FIG. 24B shows a top view of FIG. 23 with the same reduced scale as FIG. 24A. As can be seen from the comparison between FIGS. 24A and 24B, the area of the memory element (the area of the opening) is 10 µm×10 µm in the both figures. However, the area of the memory cell in the present invention is 18 µm×24 µM=432 µm²; on the other hand, the area of that in the comparative example is 30 µm×30 µm=900 µm². The size of the memory cell of the present invention is 48% of that of the memory cell in the comparative example.

In order to surely apply writing voltage to the memory element, it is necessary to relatively increase the channel length and the channel width of the TFT as a switching element of the memory cell. Accordingly, the gate length increases to cause the necessity of forming a plurality of contact holes, which expands the area occupied by the TFTs.

On the other hand, the diode has no gate electrodes and is a two-terminal element. Therefore, as shown in FIG. 22A, only such a margin may be taken into consideration that can form the contact holes 40 and 41 for connecting the diode to the word line. As a result, the area occupied by the diode decreases in the memory cell, which can reduce the size of the memory cell without changing the size of the memory element. Thus, by providing the diode in the memory cell, increase in capacity becomes possible.

Embodiment 1

This embodiment will explain an example of applying a memory device of the present invention to a semiconductor device capable of inputting and outputting data without contact. The semiconductor device capable of inputting and outputting data without contact is also referred to as an RFID tag, an ID tag, an IC tag, an IC chip, an RF tag, a wireless tag, an electronic tag, or a wireless chip.

Figure 25:
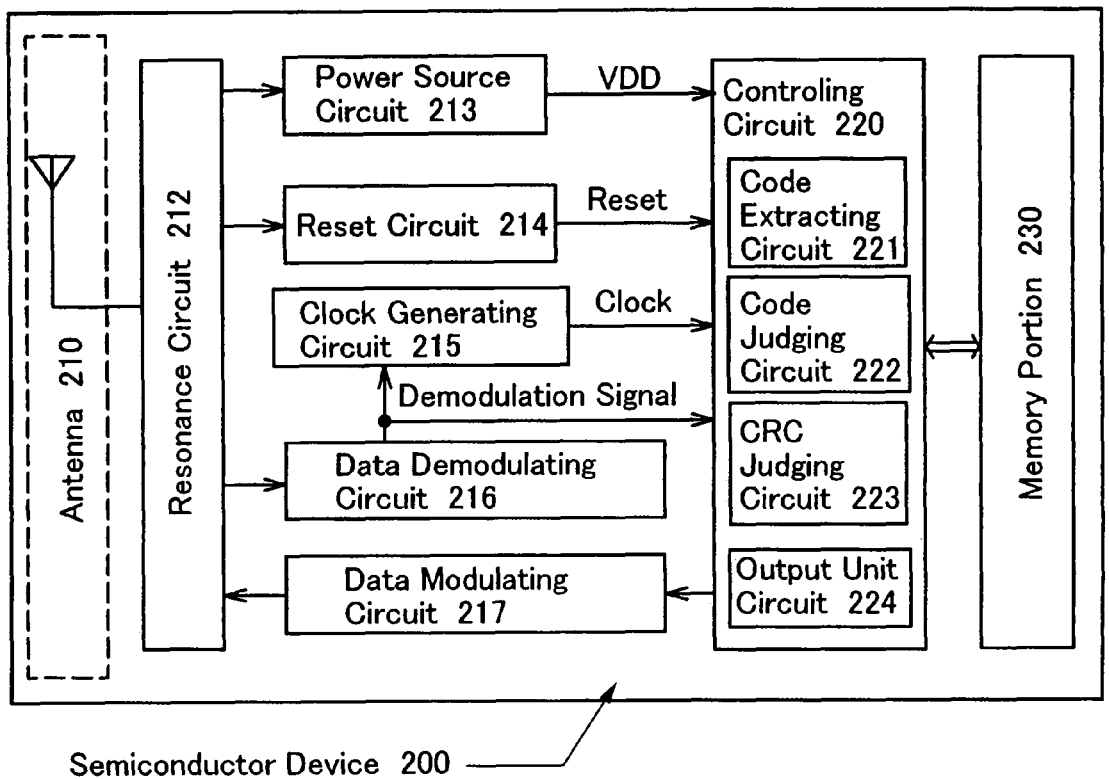
FIG. 25 is a block diagram showing a structure example of a semiconductor device (Embodiment 1)

FIG. 25 is a block diagram showing a structure example of a semiconductor device 200 of this embodiment. The semiconductor device 200 has an antenna 210 to exchange data without contact. The semiconductor device 200 further includes a resonance circuit 212, a power source circuit 213, a reset circuit 214, a clock generating circuit 215, a data demodulating circuit 216, a data modulating circuit 217, a controlling circuit 220 for controlling another circuit, and a memory portion 230, as signal processing circuits which process signals received with the antenna and supply signals for transmission to the antenna.

The resonance circuit 212 is a circuit in which a capacitor and a coil are connected to each other in parallel, and which receives a signal with the antenna 210 and outputs from the antenna 210 a signal received from the data modulating circuit 217. The power source circuit 213 is a circuit for generating a power source potential based on a received signal. The reset circuit 214 is a circuit for generating a reset signal. The clock generating circuit 215 is a circuit for generating various clock signals based on a received signal inputted through the antenna 210. The data demodulating circuit 216 is a circuit for demodulating a received signal and outputting the demodulated signal to the controlling circuit 220. The data modulating circuit 217 is a circuit for modulating a signal received from the controlling circuit 220.

The structure of the memory portion 230 is similar to the structures shown in Embodiment Modes 1 and 2. That is to say, the memory portion 230 includes a memory cell array and a logic circuit as shown in FIG. 11. Moreover, the memory cell array includes a memory cell in which a diode is directly connected to a memory element as shown in FIG. 12.

As the controlling circuit 220, for example, a code extracting circuit 221, a code judging circuit 222, a CRC judging circuit 223, and an output unit circuit 224 are provided. The code extracting circuit 221 is a circuit for extracting each of a plurality of codes included in an instruction transmitted to the controlling circuit 220. The code judging circuit 222 is a circuit for judging the content of the instruction by comparing the extracted code and a code corresponding to a reference. The CRC judging circuit 223 is a circuit for detecting whether there is a transmission error or the like based on the judged code.

Next, an example of an operation of the semiconductor device 200 is explained. After receiving a wireless signal with the antenna 210, the wireless signal is transmitted to the power source circuit 213 via the resonance circuit 212, thereby generating a high power source potential (hereinafter referred to as a VDD). The VDD is supplied to each circuit in the semiconductor device 200. The signal transmitted to the data demodulating circuit 216 via the resonance circuit 212 is demodulated (hereinafter the demodulated signal is referred to as a demodulation signal). Moreover, the signals passed through the reset circuit 214 and the clock generating circuit 215 via the resonance circuit 212 and the demodulation signal are transmitted to the controlling circuit 220. The signals transmitted to the controlling circuit 220 are analyzed by the code extracting circuit 221, the code judging circuit 222, the CRC judging circuit 223, and the like. The information of the semiconductor device stored in the memory portion 230 is outputted in accordance with the analyzed signals. The outputted information of the semiconductor device is encoded through the output unit circuit 224. The encoded information of the semiconductor device 200 is transmitted as a wireless signal by the antenna 210 through the data modulating circuit 217. In the plural circuits of the semiconductor device 200, a low power source potential (hereinafter referred to as VSS) is common, and the VSS can be GND. The memory circuit shown in the above embodiment mode can be applied to the memory portion 230.

Thus, the data of the semiconductor device can be read by transmitting a signal from a reader/writer to the semiconductor device 200 and receiving the signal transmitted from the semiconductor device 200 by the reader/writer.

The semiconductor device 200 can supply a power source voltage to each circuit by an electromagnetic wave without mounting a power source (battery). Alternatively, the semiconductor device 200 can have a power source (battery) mounted to supply a power source voltage to each circuit by an electromagnetic wave and the power source (battery).

Figure 26A:
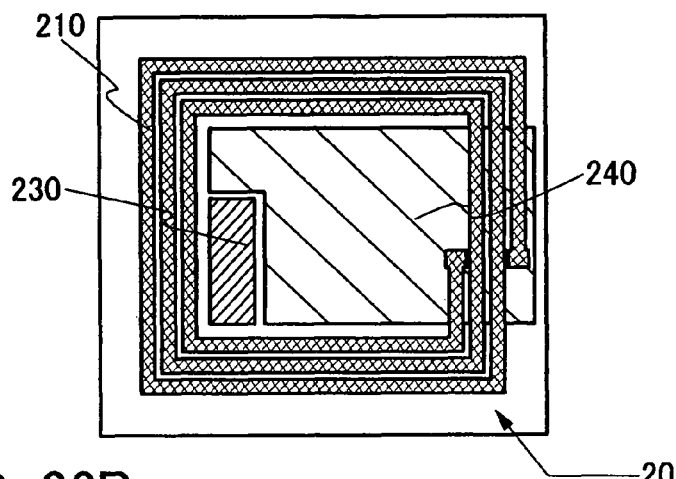
FIG. 26A explains a top-surface structure of a semiconductor device, and FIG. 26B explains a cross-sectional structure (Embodiment 1)
Figure 26B:
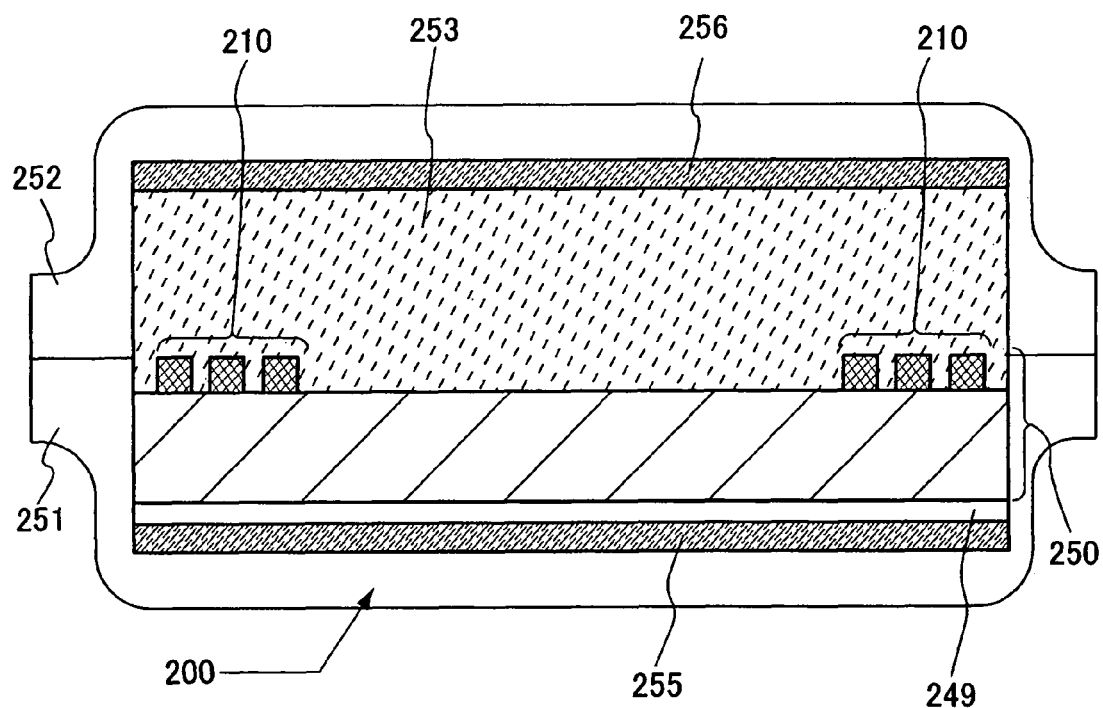

Next, an example of a structure of the aforementioned semiconductor device is explained with reference to drawings. FIG. 26A shows an example of a top-surface structure of the semiconductor device 200. FIG. 26B shows an example of a cross-sectional structure.

As shown in FIG. 26A, the semiconductor device 200 is provided with the memory portion 230, an integrated circuit portion 240, and the antenna 210. The integrated circuit portion 240 corresponds to circuits except the antenna 210 and the memory portion 230 shown in FIG. 25.

The antenna 210 may be provided so as to overlap with the memory portion 230 or may be provided around so as not to overlap with the memory portion 230. In the former case, the antenna 210 may be overlapped either wholly or partially.

As a method for wirelessly transmitting signals by the semiconductor device 200, an electromagnetic coupling method, an electromagnetic induction method, a microwave method, or the like can be used. The transmission method may be selected appropriately in consideration of the purpose by a practitioner, and a suitable antenna may be provided in accordance with the transmission method.

In the case of using an electromagnetic coupling method or an electromagnetic induction method (for example, 13.56 MHz band) which utilizes electromagnetic induction caused by the change in magnetic field density, a conductive film functioning as an antenna is formed in a loop shape (such as a loop antenna) or a spiral shape (such as a spiral antenna).

In the case of using a microwave method (for example, UHF band (860 to 960 MHz band), 2.45 GHz band, or the like), the shape of a conductive film functioning as an antenna, such as the length, may be appropriately set in consideration of the wavelength of an electromagnetic wave used for the signal transmission. For example, the conductive film functioning as an antenna can be formed to have a linear shape (such as a dipole antenna), a flat shape (such as a patch antenna), or a ribbon shape. The shape of the conductive film functioning as an antenna is not limited to a linear shape but may be a curved shape, a meandering shape, or a combination thereof in consideration of the wavelength of an electromagnetic wave.

The semiconductor device 200 of this embodiment is flexible, which means the device can bend or warp. In the semiconductor device 200, the antenna and the circuits are fixed not over the substrate used when manufacturing the circuits shown in FIG. 25 but over another flexible substrate. As shown in FIG. 26B, a base insulating layer 249 and an element-forming layer 250 formed over the base insulating layer 249 are sealed by a flexible substrate 251 and a flexible substrate 252. One surface of the element-forming layer 250 (corresponding to an upper surface of the substrate at the time of manufacturing), which corresponds to the antenna 210, the memory portion 230, and the integrated circuit portion 240, is provided with a protective insulating layer 253 for protecting the antenna 210.

The protective insulating layer 253 is preferably formed of a resin material. This is because the protective insulating layer 253 can be formed at low temperature, and moreover because the protective insulating layer 253 is formed to relax unevenness of the antenna 210 and can be formed by applying a composition by a coating method and drying and baking the composition. The protective insulating layer 253 is formed by using an epoxy resin layer. The flexible substrate 251 is fixed to the base insulating layer 249 by an adhesive material 255. The flexible substrate 252 is fixed to the protective insulating layer 253 by an adhesive material 256.

As later described, diodes, TFTs, capacitors, resistors, and the like that form the memory portion 230 and the integrated circuit portion 240 are formed in the element-forming layer 250. These elements are formed over one substrate, as will be described later.

Figure 27:
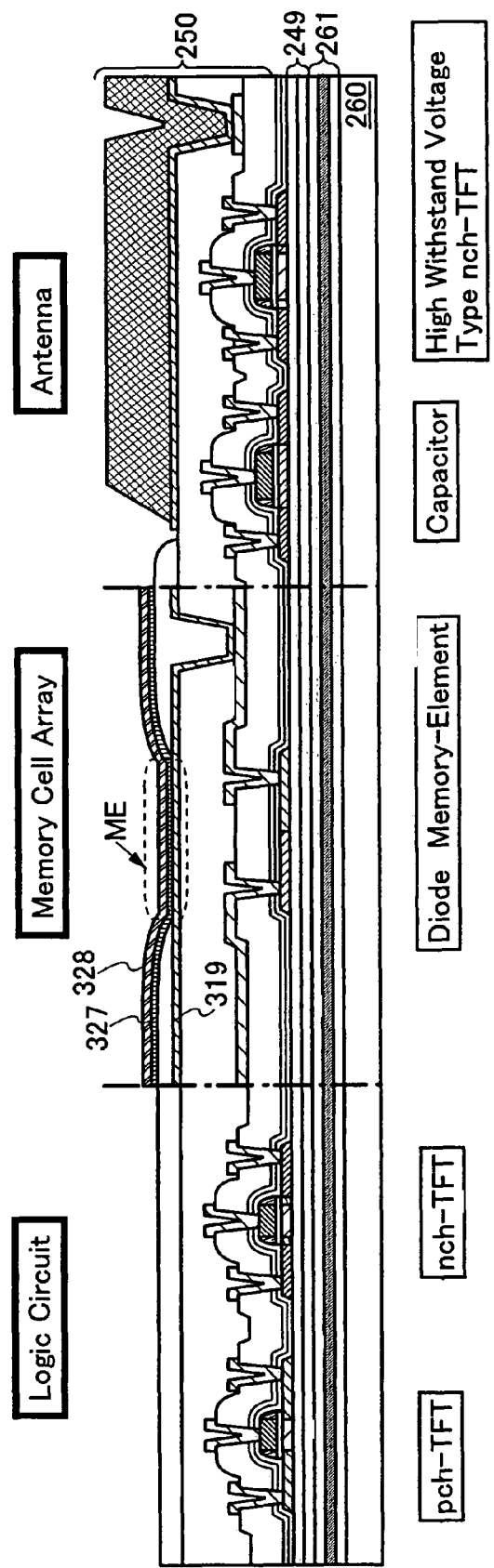
FIG. 27 shows a cross section of an element-forming layer of a semiconductor device (Embodiment 1)

FIG. 27 shows a schematic cross-sectional structure of the element-forming layer 250. The cross-sectional structure is illustrated similarly to FIG. 1A. The cross section of the memory cell of the memory portion 230 is shown in the center of FIG. 27. In the memory cell, a memory element is stacked over a diode. The left part of the drawing shows a cross section of a p-channel TFT (also referred to as a p-ch TFT) and an n-channel TFT (also referred to as an n-ch TFT) as a part of the cross section of the logic circuit in the memory portion 230. The right part of the drawing shows a cross section of a part of the antenna 210 as well as a capacitor of the resonance circuit 212 and an n-channel TFT of a high withstand voltage type of the power source circuit 213 as a part of the cross section of the integrated circuit portion 240. It is needless to say that the integrated circuit portion 240 is also provided with p-channel TFTs and n-channel TFTs similarly to the logic circuit on the left part of the drawing, in addition to the TFT of a high withstand voltage type, and moreover that the memory portion 230 and the integrated circuit portion 240 are each provided with a plurality of TFTs and capacitors shown in FIG. 27.

A substrate 260 is a substrate used when the element-forming layer 250 is manufactured. In this embodiment, a glass substrate is used as the substrate 260. A peeling layer 261 is formed over the substrate 260, which is used to remove the substrate 260 from the element-forming layer 250. The peeling layer 261 is formed over the substrate 260, and the base insulating layer 249 is formed over the peeling layer 261, and then the element-forming layer 250 including TFTs and the like is formed over the base insulating layer 249. A method for forming the element-forming layer 250 is explained hereinafter with reference to the cross-sectional views shown in FIGS. 28 to 32 and FIG. 27.

The substrate 260 is a glass substrate. As shown in FIG. 28A, the peeling layer 261 including three layers 261a to 261c is formed over the substrate 260. The first layer 261a is formed by a silicon oxynitride film ($SiO_xN_y$, x>y) of 100 nm thick by a parallel plate type plasma CVD apparatus using $SiH_4$ and $N_2O$ as a material gas. The second layer 261b is formed by a tungsten film of 30 nm thick using a sputtering apparatus. The third layer 261c is formed by a silicon oxide film of 200 nm thick using a sputtering apparatus.

By the formation of the third layer 261c (silicon oxide), a surface of the second layer 261b (tungsten) is oxidized to form tungsten oxide at the interface. By the formation of the tungsten oxide, the substrate 261 can be easily separated when the element-forming layer 250 is transferred to another substrate later. The first layer 261a is a layer for keeping close contact with the second layer 261b during the manufacturing of the element-forming layer 250.

The second layer 261b is preferably formed by a metal film including tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ur), or the like or a film of a compound of such metal. The second layer 261b can have a thickness of 20 nm to 40 nm.

As shown in FIG. 28B, the base insulating layer 249 having a two-layer structure is formed over the peeling layer 261. The first layer 249a is formed of silicon oxynitride ($SiO_xN_y$, x<y) in 50 nm thick by a plasma CVD apparatus using $SiH_4$, $N_2O$, $NH_3$, and $H_2$ as a material gas. The barrier property is increased by setting the composition ratio of nitrogen of the first layer 249a to be 40% or more. The second layer 249b is formed of silicon oxynitride ($SiO_xN_y$, x>y) in 100 nm thick by a plasma CVD apparatus using $SiH_4$ and $N_2O$ as a material gas. The composition ratio of nitrogen of the second layer 249b is set 0.5% or less.

As shown in FIG. 28C, a crystalline silicon film 271 is formed over the base insulating layer 249. The crystalline silicon film 271 is manufactured by the following method. An amorphous silicon film is formed in 66 nm thick by a plasma CVD apparatus using $SiH_4$ and $H_2$ as a material gas. The amorphous silicon film is irradiated with a laser so as to be crystallized; thus, the crystalline silicon film 271 is obtained. An example of a laser irradiation method is shown. A second harmonic (wavelength: 532 nm) of an LD-pumped $YVO_4$ laser is used for the irradiation. It is not necessary to limit to the second harmonic in particular, but the second harmonic is superior to third or higher-order harmonics in point of energy efficiency. The condition is adjusted so that the beam on the irradiation surface has a linear shape with a length of about 500 μm and a width of about 20 μm and an intensity of 10 to 20 W by an optical system. The beam is moved relative to the substrate at a speed of 10 to 50 cm/sec.

As shown in FIG. 28D, a p-type impurity is added to the crystalline silicon film 271. Here, diborane ($B_2H_6$) diluted with hydrogen is used as a doping gas in an ion doping apparatus, so that boron is added to the entire crystalline silicon film 271. The crystalline silicon obtained by crystallizing amorphous silicon has a dangling bond; therefore, it is not intrinsic silicon but has a low n-type conductivity. Accordingly, addition of a minute amount of p-type impurities provides an effect of making the amorphous silicon film 271 into intrinsic silicon. The step in FIG. 28D may be conducted as necessary.

Next, as shown in FIG. 28E, the crystalline silicon film 271 is divided for each element to form semiconductor films 272 to 276. In the semiconductor film 272, a diode of the memory cell is formed. By the use of the semiconductor films 273 to 275, channel formation regions, source regions, and drain regions of TFTs are formed. The semiconductor film 276 forms an electrode of an MIS capacitor. An example of a method for processing the crystalline silicon film 271 is shown. A resist is formed over the crystalline silicon film 271 by a photolithography step, and the crystalline silicon film 271 is etched by using the resist as a mask and using $SF_6$ and $O_2$ as an etching gas by a dry etching apparatus; thus, the semiconductor films 272 to 276 are formed in predetermined shapes.

As shown in FIG. 29A, a resist R31 is formed by a photolithography step and a minute amount of p-type impurities are added to the semiconductor films 274 and 275 of the n-channel TFTs. Here, diborane ($B_2H_6$) diluted with hydrogen is used as a doping gas so that the semiconductor films 274 and 275 are doped with boron by an ion doping apparatus. The resist R31 is removed after the completion of the doping.

The step in FIG. 29A is performed to avoid that the threshold voltage of the n-channel TFT becomes negative. Boron may be added to the semiconductor films 274 and 275 of the n-channel TFTs at a concentration of $5\times10^{15}$ atoms/cm$^3$ to $1\times10^{17}$ atoms/cm$^3$. The step in FIG. 29A may be conducted as necessary. Moreover, the p-type impurity may be added to the semiconductor film 272 of the memory cell.

As shown in FIG. 29B, an insulating film 277 is formed over the entire surface of the substrate 260. The insulating film 277 functions as a gate insulating film for the TFTs and a dielectric for the capacitor. Here, the insulating film 277 is formed by a silicon oxynitride film ($SiO_xN_y$, x>y) in 20 nm to 40 nm thick by a plasma CVD apparatus using $SiH_4$ and $N_2O$ as a material gas.

As shown in FIG. 29C, a resist R32 is formed by a photolithography step, and an n-type impurity is added to the semiconductor film 272 of the memory cell and the semiconductor film 276 of the capacitor. By this step, the concentration of the n-type impurity in each of the n-type impurity region of the semiconductor film 272 and the n-type impurity region functioning as one electrode of the capacitor is determined. Phosphine ($PH_3$) diluted with hydrogen is used as a doping gas, so that the semiconductor films 272 and 276 are doped with phosphorus by using an ion doping apparatus. Thus, the entire semiconductor film 272 becomes an n-type impurity region 278 and the entire semiconductor film 276 becomes an n-type impurity region 279. The resist R32 is removed after the completion of the doping step.

As shown in FIG. 29D, a conductive film 281 is formed over the insulating film 277. The conductive film 281 forms a gate electrode of the TFT, and the like. Here, the conductive film 281 has a two-layer structure. The first layer is formed of tantalum nitride (TaN) in 30 nm thick and the second layer is formed of tungsten (W) in 370 nm thick. The tantalum nitride and the tungsten are formed by a sputtering apparatus.

Figure 30A:
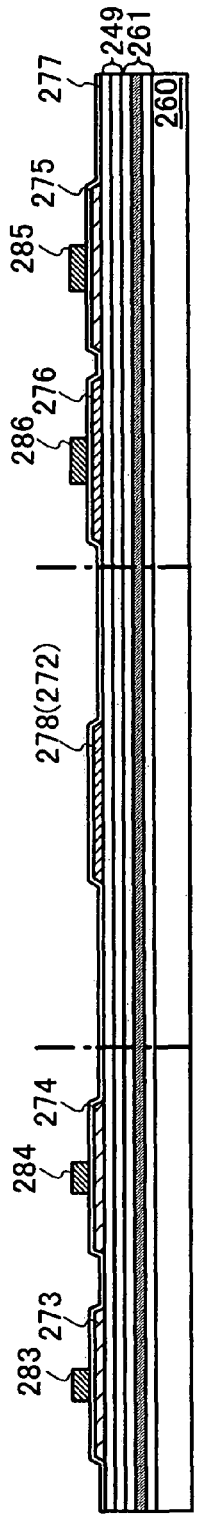
FIGS. 30A to 30D show cross sections each explaining a process for manufacturing an element-forming layer of a semiconductor device (Embodiment 1)

A resist is formed over the conductive film 281 by a photolithography step, and the conductive film 281 is etched by an etching apparatus. Thus, first conductive films 283 to 286 are formed over the semiconductor films 273 to 276 as shown in FIG. 30A. The first conductive films 283 to 286 serve as gate electrodes or gate wires of the TFFS. In the n-channel TFT of a high withstand voltage type, the conductive film 285 is formed so that the gate width (channel length) is larger than that in the other TFTs. The first conductive film 286 forms one electrode of the capacitor.

The conductive film 281 is etched by a dry etching method. As an etching apparatus, an ICP (Inductively Coupled Plasma) etching apparatus is used. As an etching gas, a mixed gas of $Cl_2$, $SF_6$, and $O_2$ is used first in order to etch the tungsten, and then the etching gas to be introduced in a process chamber is changed to only a $Cl_2$ gas to etch the tantalum nitride.

Figure 30B:
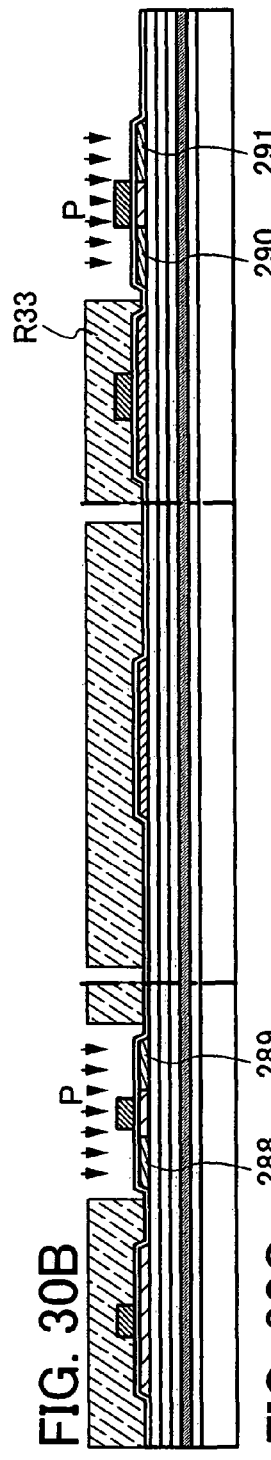

As shown in FIG. 30B, a resist R33 is formed by a photolithography step. An n-type impurity is added to the semiconductor films 274 and 275 of the n-channel TFT. N-type low-concentration impurity regions 288 and 289 are formed in a self-aligning manner in the semiconductor film 274 by using the first conductive film 284 as a mask, and n-type low-concentration impurity regions 290 and 291 are formed in a self-aligning manner in the semiconductor film 275 by using the first conductive film 285 as a mask. In this embodiment, phosphine (PH$_3$) diluted with hydrogen is used as a doping gas, and phosphorus is added to the semiconductor films 274 and 275 by an ion doping apparatus. The step of FIG. 30B is a step for forming an LDD region in the n-channel TFT. The n-type impurity is included in the n-type low-concentration impurity regions 288 and 289 at a concentration of $1 \times 10^{16}$ atoms/cm$^3$ to $5 \times 10^{18}$ atoms/cm$^3$.

Figure 30C:
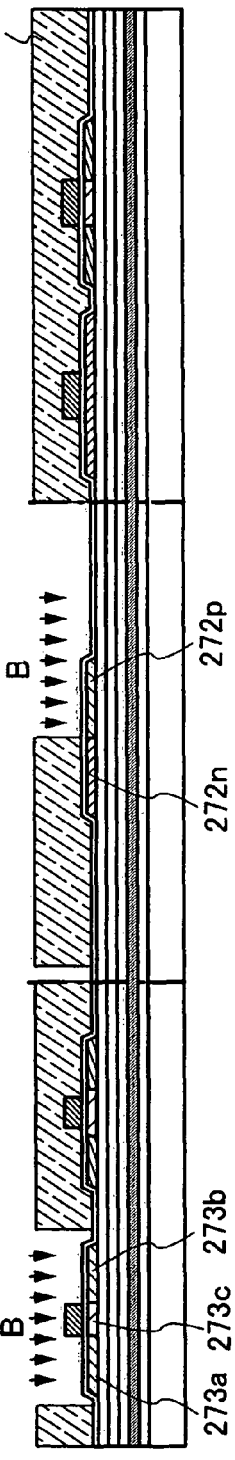

As shown in FIG. 30C, a resist R34 is formed by a photolithography step. A p-type impurity is added to the semiconductor film 272 of the memory cell and the semiconductor film 273 of the p-channel TFT. Since a part of the semiconductor film 272 which remains as an n-type impurity region 272n is covered with the resist R34, an exposed region 272p becomes a p-type impurity region. By this impurity addition step, the n-type impurity region 272n and the p-type impurity region 272p constituting pn junction are formed in the semiconductor film 272. Since the semiconductor film 272 is formed in advance as the n-type impurity region 278, the p-type impurity is added at higher concentration than the n-type impurity added in advance so that the region 272p has p-type conductivity.

P-type high-concentration impurity regions 273a and 273b are formed in a self-aligning manner in the semiconductor film 273 by using the first conductive film 283 as a mask. A region 273c covered with the first conductive film 283 is formed in a self-aligning manner as the channel formation region.

The p-type impurity regions are formed by doping the semiconductor films 274 and 275 with boron by an ion doping apparatus using diborane (B$_2$H$_6$) diluted with hydrogen as a doping gas. The resist R34 is removed after the completion of the doping.

Figure 30D:
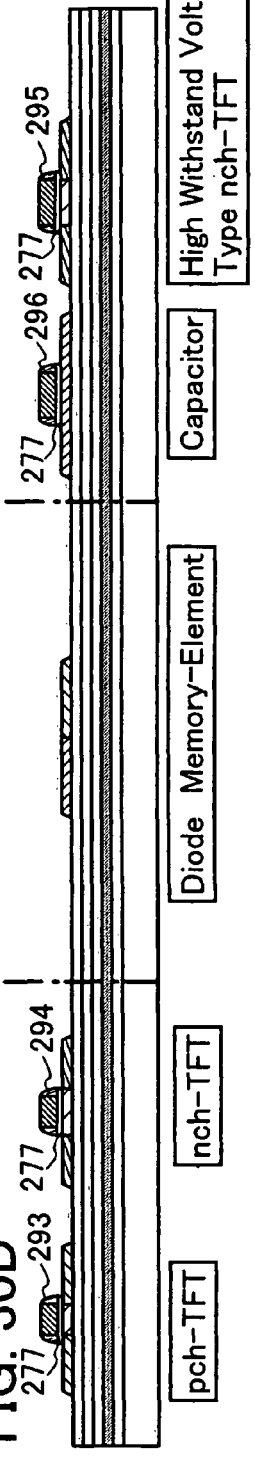
Figure 33A:
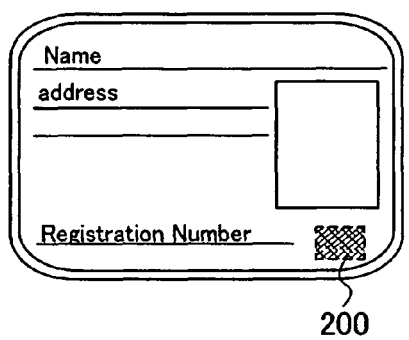
FIG. 33A shows an example of identification certificates.
Figure 33B:
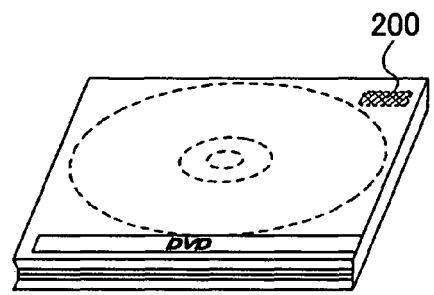
FIG. 33B shows an example of recording media.
Figure 33C:
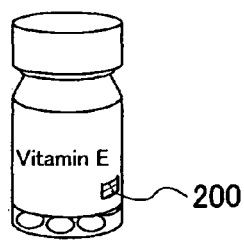
FIG. 33C shows an example of pack cases.
Figure 33D:
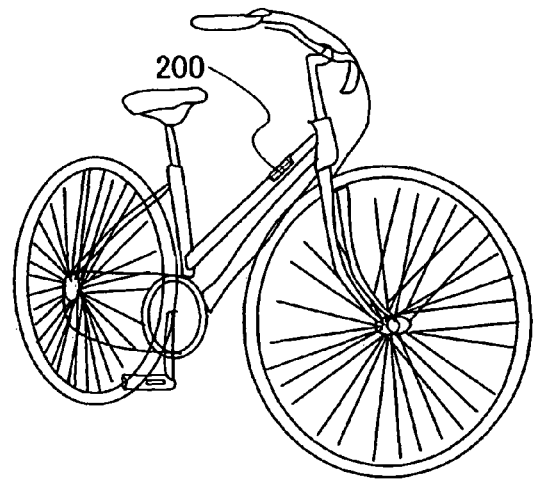
FIG. 33D shows an example of vehicles.
Figure 33E:
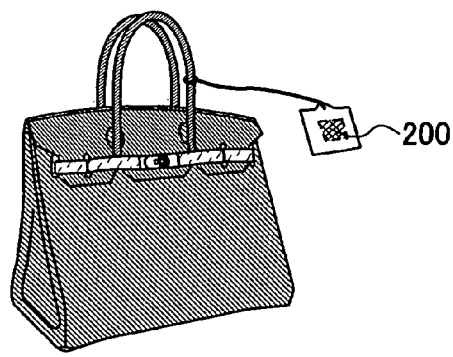
FIG. 33E shows an example of personal belongings.
Figure 33F:
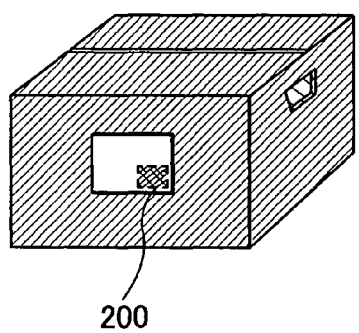
FIG. 33F shows an example of luggage tugs, all of which explain a method of using a semiconductor device (Embodiment 2).

As shown in FIG. 30D, insulating layers 293 to 296 are formed beside the first conductive films 283 to 286. The insulating layers 293 to 296 are called sidewalls or side walls. First, a silicon oxynitride film (SiO$_x$N$_y$, x>y) is formed in 100 nm thick by a plasma CVD apparatus using SiH$_4$ and N$_2$O as a material gas. Subsequently, a silicon oxide film is formed in 200 nm thick by an LPCVD apparatus using SiH$_4$ and N$_2$O as a material gas. Next, the silicon oxide film and the silicon oxynitride film are subjected to dry etching treatment (etch back treatment), thereby forming the insulating layer 293 to 296. In accordance with a sequence of these steps, the insulating film 277 formed of silicon oxynitride is also etched and the insulating film 277 is left only under the first conductive films 283 to 286 and the insulating layers 293 to 296.

As shown in FIG. 31A, a resist R35 is formed by a photolithography step. An n-type impurity is added to the semiconductor films 274 and 275 of the n-channel TFTs and the semiconductor film 276 of the capacitor, thereby forming n-type high-concentration impurity regions. In the semiconductor film 274, the n-type impurity is further added to the n-type low-concentration impurity regions 288 and 289 (see FIG. 30B) by using the first conductive film 284 and the insulating layer 294 as masks, thereby forming n-type high-concentration impurity regions 274a and 274b in a self-aligning manner. A region 274c overlapping with the first conductive film 284 is determined as a channel formation region in a self-aligning manner. In addition, regions of the n-type low-concentration impurity regions 288 and 289 that overlap with the insulating layer 294 remain as n-type low-concentration impurity regions 274e and 274d.

Similarly to the semiconductor film 274, n-type high-concentration impurity regions 275a and 275b, a channel formation region 275c, and n-type low-concentration impurity regions 275e and 275d are formed in the semiconductor film 275.

At this time, the entire semiconductor film 276 becomes the n-type impurity region 279 (see FIG. 29C). An n-type impurity is further added to the n-type impurity region 279 by using the first conductive film 286 and the insulating layer 296 as masks, thereby forming n-type high-concentration impurity regions 276a and 276b in a self-aligning manner. A region of the semiconductor film 276 that overlaps with the first conductive film 286 and the insulating layer 296 is determined as an n-type impurity region 276c.

In the step of adding the n-type impurity, as aforementioned, an ion doping apparatus may be used and phosphine (PH$_3$) diluted with hydrogen may be used as a doping gas. The n-type high-concentration impurity regions 274a, 274b, 275a, and 275b of the n-channel TFTs are doped with phosphorus so that the concentration of phosphorus ranges from $1 \times 10^{20}$ atoms/cm$^3$ to $2 \times 10^{21}$ atoms/cm$^3$.

As mentioned above, in this embodiment, the n-type impurity region 272n and the p-type impurity region 272p of the memory cell are formed in accordance with a sequence of steps of adding impurities to the semiconductor films for the thin film transistors and the capacitor. In this embodiment, the concentration of the n-type impurity and the p-type impurity is the same in the n-type impurity region 272n and the n-type high-concentration impurity regions 276a and 276b of the capacitor. Thus, their sheet resistance is the same. The p-type impurity region 272p has the same concentration of the p-type impurity as the p-type high-concentration impurity regions 273a and 273b of the p-channel thin film transistor; however, the former has higher concentration of the n-type impurity than the latter. Moreover, the p-type impurity region 272p has the same concentration of the n-type impurity as the n-type impurity region 276c of the capacitor.

The resist R35 is removed to form a cap insulating film 298 as shown in FIG. 31B. The cap insulating film 298 is formed by a silicon oxynitride film (SiO$_x$N$_y$, x>y) in 50 nm thick by a plasma CVD apparatus. SiH$_4$ and N$_2$O are used as a material gas to form the silicon oxynitride film. After forming the cap insulating film 298, heat treatment is performed in a nitrogenous atmosphere of 550° C. to activate the n-type impurity and the p-type impurity added in the semiconductor films 272 to 276.

As shown in FIG. 31C, first interlayer insulating films 299 and 300 are formed. The first interlayer insulating film 299 as a first layer is formed of silicon oxynitride (SiO$_x$N$_y$, x<y) in 100 nm thick by a plasma CVD apparatus using SiH$_4$ and N$_2$O as a material gas. The first interlayer insulating film 300 as a second layer is formed of silicon oxynitride (SiO$_x$N$_y$, x>y) in 600 nm thick by using SiH$_4$, N$_2$O, NH$_3$, and H$_2$ as a material gas by a plasma CVD apparatus.

The first interlayer insulating film 299 and 300 and the cap insulating film 298 are removed by a photolithography step and a dry etching step, thereby forming contact holes. A conductive film is formed over the first interlayer insulating film 300. Here, the conductive film is formed to have a four-layer structure in which Ti of 60 nm thick, TiN of 40 nm thick, pure aluminum of 500 m thick, and Ti of 100 nm thick are stacked in order from the bottom. These layers are formed by a sputtering apparatus. The conductive film is processed into a predetermined shape by a photolithography step and a dry etching step, thereby forming second conductive films 301 to 314.

Although the second conductive films and the first conductive film are connected to each other over the semiconductor film in the drawing in order to explain the connection between the second conductive films and the first conductive film, in fact, the second conductive films and the first conductive film are formed so that the contact portion therebetween does not overlap with the semiconductor film.

The second conductive film 301 of the memory cell forms a word line. The second conductive film 302 forms an electrode for connecting the diode with the memory element and is divided for each memory cell. The n-type high-concentration impurity regions 276a and 276b are connected to each other by the second conductive film 312. Accordingly, an MIS capacitor of a stacked-layer structure including the n-type impurity region 276c, the insulating film 277, and the first conductive film 286 is formed. The second conductive film 314 forms a terminal of the integrated circuit portion 240, to which the antenna 210 is connected.

As shown in FIG. 31D, a second interlayer insulating film 316 is formed. In the second interlayer insulating film 316, contact holes 317 and 318 reaching the second conductive films 302 and 316 are formed. An example of forming the second interlayer insulating film 316 with photosensitive polyimide is shown. Polyimide is applied in 1.5 μm thick by using a spinner. The polyimide is light-exposed by a photolithography step and developed, thereby forming polyimide having the contact holes 317 and 318. After the development, the polyimide is baked.

As shown in FIG. 32A, a conductive film is formed over the second interlayer insulating film 316. This conductive film is processed into a predetermined shape by a photolithography step and an etching step, thereby forming third conductive films 319 and 320. The conductive film that constitutes the third conductive films 319 and 320 is formed of Ti in 100 nm thick by a sputtering apparatus. The third conductive film 319 serves as a lower electrode of the memory element ME and is formed separately for each memory cell. The third conductive film 320 serves as a bump of the antenna for connecting the antenna 210 with the terminal (second conductive film 314) of the integrated circuit portion 240.

As shown in FIG. 32B, a third interlayer insulating film 321 having openings 322 and 323 is formed. Here, the third interlayer insulating film 321 is formed of photosensitive polyimide by a similar method to the second interlayer insulating film 316. The position, the area, and the shape of the memory element is determined based on the opening 322. The opening 323 is formed in a region where the antenna 210 is formed.

As shown in FIG. 32C, a conductive film 326 functioning as the antenna 210 is formed in the opening 323. The conductive film 326 with a predetermined shape is formed in the opening 323 by evaporating aluminum using a metal mask with the use of an evaporation apparatus.

As shown in FIG. 27, an organic compound layer 327 and a fourth conductive film 328 are formed in the opening 322, thereby forming the memory element. The organic compound layer 327 and the fourth conductive film 328 are both formed by evaporation by an evaporation apparatus using a metal mask. The fourth conductive film 328 constitutes a part of a bit line of the memory cell. In accordance with the steps shown in FIGS. 28 to 32 and FIG. 27, the element-forming layer 250 is formed over the substrate 260.

Although the semiconductor film 276 of the capacitor has the n-type impurity region, it may have a p-type impurity region. In the latter case, a p-type impurity is added in the step of FIG. 29C. In the step of FIG. 29C, the entire semiconductor film 272 of the memory cell is made into a p-type impurity region. Therefore, in the step of FIG. 30C, the p-type impurity is not added to the semiconductor film 272. Then, the n-type impurity is added in a predetermined region of the semiconductor film 272 in the step of FIG. 31A.

Next, a step of sealing the element-forming layer 250 between the flexible substrates 251 and 252 is explained with reference to FIG. 26B.

The protective insulating layer 253 for protecting the antenna 210 and the memory element is formed. The insulating films stacked in the element-forming layer 250 are removed together with the protective insulating layer 253 by a photolithography step and an etching step or by laser irradiation, thereby forming openings that reach the peeling layer 261. Not only the element-forming layer 250 for one semiconductor device 200 but also a number of the same element-forming layers 250 are formed over the substrate 260. The openings are formed to divide the element-forming layers from each other.

Subsequently, after temporarily fixing the substrate for transfer onto the protective insulating layer 253, the substrate 260 is peeled. Since the bond of the second layer 261b and the third layer 261c of the peeling layer 261 at the interface therebetween is weak, the peeling progresses from the end of the opening by applying a physical force, thereby peeling the substrate 260 from the element-forming layer 250. The base insulating layer 249 from which the substrate 260 has been peeled is fixed to the flexible substrate 251 with the adhesive material 255. Then, the substrate for the transfer is detached. The other flexible substrate 252 is fixed to the protective insulating layer 253 with the adhesive material 256. Then, by performing heat treatment while applying pressure from the outside of the flexible substrates 251 and 252, the element-forming layer 250 is sealed by the flexible substrate 251 and the flexible substrate 252.

Although this embodiment explains the example of forming the antenna 210 together with the integrated circuit portion 240, the formation of the antenna 210 can be omitted. In the latter case, the antenna may be formed over the flexible substrate and may be attached so as to electrically connect with the integrated circuit portion 240 of the element-forming layer 250.

Moreover, although this embodiment explains the example of peeling the substrate 260 used for the manufacturing from the element-forming layer 250, the substrate used for the manufacturing can be left behind. In the latter case, the substrate may be thinned by polishing or grinding the substrate so that the substrate warps.

The semiconductor device 200 of this embodiment functions as a wireless chip, and is compact, thin, and lightweight, and moreover flexible. Thus, even when the semiconductor device 200 is attached to a product, the appearance, the design, and the quality of the product do not deteriorate. Embodiment 2 will explain a method of using the semiconductor device 200.

Embodiment 2

A method of using the semiconductor device 200 functioning as a wireless chip, which is described in Embodiment 1, is explained with reference to FIGS. 33A to 33F. A wireless chip can be applied to a wide range of purposes. For example, the wireless chip can be attached to bank notes, coins, documents of value, bearer bonds, identification certificates (such as a driver's license or a residence card, refer to FIG. 33A), pack cases (such as package paper or a bottle, refer to FIG. 33C), recording media (such as DVD software or a video tape, refer to FIG. 33B), vehicles (such as a bicycle, refer to FIG. 33D), personal belongings (such as a bag or glasses), foods, plants, animals, human bodies, clothes, general merchandise, electronic appliances, luggage tags (refer to FIGS. 33E and 33F), and the like. The electronic appliances include a liquid crystal display device, an EL display device, a television device (also referred to as a TV, a TV receiver, or a television receiver), a mobile phone, and the like.

The semiconductor device 200 of the present invention has a memory element of the present invention and is fixed to a product by mounting the device onto a printed board, attaching the device to a surface of the product, or embedding the device inside the product. For example, if the product is a book, the device is fixed to the book by embedding the device inside paper, and if the product is a package made of an organic resin, the device is fixed to the package by embedding the device inside the organic resin. Since the semiconductor device 200 of the present invention can be compact, thin, and lightweight, it does not degrade the quality of design even after the device is fixed to a product. When the semiconductor device 200 of the present invention is provided to bank notes, coins, documents of value, bearer bonds, identification certificates, and the like, an authorization function can be provided. With the use of this authorization function, the forgery can be prevented. Further, when the semiconductor device is attached to pack cases, recording media, personal belongings, foods, clothes, general merchandise, electronic appliances, and the like, systems such as an inspection system can be made efficient.

This application is based on Japanese Patent Application serial no. 2006-127087 filed in Japan Patent Office on Apr. 28, 2006, the entire contents of which are hereby incorporated by reference.

What is claimed is:

1. A memory device comprising:
a thin film transistor; and
a memory cell array including a memory cell,
wherein the memory cell comprises:
   a first semiconductor film having an n-type impurity region and a p-type impurity region that are adjacent to each other;
   a first conductive film which is formed over the first semiconductor film and which is connected to the n-type impurity region;
   a second conductive film which is formed over the first conductive film;
   an organic compound layer interposed between the first conductive film and the second conductive film; and
   a third conductive film which is formed over the first semiconductor film and which is connected to the p-type impurity region, and
wherein the first semiconductor film of the memory cell is formed over the same insulating surface as a second semiconductor film of the thin film transistor.

2. A memory device comprising:
an n-channel thin film transistor;
a p-channel thin film transistor; and
a memory cell array including a memory cell,
wherein the memory cell comprises:
   a first semiconductor film having an n-type impurity region and a p-type impurity region that are adjacent to each other;
   a first conductive film which is formed over the first semiconductor film and which is connected to the n-type impurity region;
   a second conductive film which is formed over the first conductive film; and
   an organic compound layer interposed between the first conductive film and the second conductive film; and
   a third conductive film which is formed over the first semiconductor film and which is connected to the p-type impurity region,
wherein the first semiconductor film of the memory cell is formed over the same insulating surface as a second semiconductor film of the n-channel thin film transistor and a third semiconductor film of the p-channel thin film transistor.

3. The memory device according to claim 2, wherein a concentration of an n-type impurity in the n-type impurity region of the first semiconductor film of the memory cell is equal to a concentration of an n-type impurity of an n-type impurity region formed in the second semiconductor film of the n-channel thin film transistor.

4. The memory device according to claim 2, wherein a concentration of a p-type impurity in the p-type impurity region of the first semiconductor film of the memory cell is equal to a concentration of a p-type impurity of a p-type impurity region formed in the third semiconductor film of the p-channel thin film transistor.

5. A semiconductor device comprising:
a memory cell array including a memory cell;
a circuit for writing data in the memory cell array and reading data from the memory cell array;
an antenna; and
a signal processing circuit, wherein the signal processing circuit processes a signal received with the antenna and supplies a signal to the antenna,
wherein the memory cell comprises:
   a first semiconductor film including an n-type impurity region and a p-type impurity region that are adjacent to each other;
   a first conductive film which is formed over the first semiconductor film and which is connected to the n-type impurity region;
   a second conductive film which is formed over the first conductive film; and
   an organic compound layer interposed between the first conductive film and the second conductive film; and
   a third conductive film which is formed over the first semiconductor film and which is connected to the p-type impurity region,
wherein the signal processing circuit includes an n-channel thin film transistor, a p-channel thin film transistor, and a capacitor, and
wherein the first semiconductor film of the memory cell is formed over the same insulating surface as a second semiconductor film of the n-channel thin film transistor, a third semiconductor film of the p-channel thin film transistor, and a fourth semiconductor film of the capacitor.

6. The semiconductor device according to claim 5, wherein a concentration of an n-type impurity in the n-type impurity region of the first semiconductor film of the memory cell is equal to a concentration of an n-type impurity of an n-type impurity region formed in the second semiconductor film of the n-channel thin film transistor.

7. The semiconductor device according to claim 5, wherein a concentration of a p-type impurity in the p-type impurity region of the first semiconductor film of the memory cell is equal to a concentration of a p-type impurity of a p-type impurity region formed in the third semiconductor film of the p-channel thin film transistor.

* * * * *